(12) United States Patent
Yamaguchi et al.

(10) Patent No.: US 11,049,742 B2
(45) Date of Patent: *Jun. 29, 2021

(54) SUBSTRATE PROCESSING APPARATUS, METHOD OF MANUFACTURING SEMICONDUCTOR DEVICE, AND THERMOCOUPLE SUPPORT

(71) Applicant: KOKUSAI ELECTRIC CORPORATION, Tokyo (JP)

(72) Inventors: Hideto Yamaguchi, Toyama (JP); Tetsuya Kosugi, Toyama (JP); Masaaki Ueno, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 149 days.

This patent is subject to a terminal disclaimer.

(21) Appl. No.: 16/531,540

(22) Filed: Aug. 5, 2019

(65) Prior Publication Data

US 2019/0355630 A1 Nov. 21, 2019

Related U.S. Application Data

(63) Continuation of application No. 15/789,311, filed on Oct. 20, 2017, now Pat. No. 10,418,293, which is a (Continued)

(30) Foreign Application Priority Data

Sep. 25, 2012 (JP) ................. 2012-210264

(51) Int. Cl.
*C23C 16/00* (2006.01)
*H01L 21/67* (2006.01)
(Continued)

(52) U.S. Cl.
CPC .......... *H01L 21/67248* (2013.01); *G01K 7/02* (2013.01); *H01L 21/67109* (2013.01); *H01L 22/26* (2013.01); *H01L 2924/0002* (2013.01)

(58) Field of Classification Search
CPC .................................. H01L 21/67248
See application file for complete search history.

(56) References Cited

U.S. PATENT DOCUMENTS

| 3,165,426 A | 1/1965 | Bechman |
| 3,400,587 A | 9/1968 | Franck |

(Continued)

FOREIGN PATENT DOCUMENTS

| JP | 63-121431 U | 8/1988 |
| JP | 08-210923 A | 8/1996 |

(Continued)

*Primary Examiner* — Keath T Chen
(74) *Attorney, Agent, or Firm* — Volpe Koenig

(57) ABSTRACT

A substrate processing apparatus includes: a reaction tube configured to accommodate a substrate holder holding a plurality of substrates and process a substrate held on the substrate holder; a heating unit installed outside the reaction tube and configured to heat an inside of the reaction tube; a protection tube installed to extend in a vertical direction in contact with an outer wall of the reaction tube; an insulating tube disposed inside the protection tube and having through-holes extending in a vertical direction; a thermocouple having a thermocouple junction provided at an upper end thereof, and thermocouple wires joined at the thermocouple junction and inserted into the through-holes of the insulating tube; a gas supply unit configured to supply a gas, for processing a substrate accommodated in the reaction tube, into the reaction tube; and an exhaust unit configured to exhaust a gas from the reaction tube.

8 Claims, 13 Drawing Sheets

Related U.S. Application Data continuation of application No. 14/033,880, filed on Sep. 23, 2013, now abandoned.

(51) Int. Cl.
  *G01K 7/02* (2021.01)
  *H01L 21/66* (2006.01)

(56) References Cited

U.S. PATENT DOCUMENTS

| | | |
|---|---|---|
| 4,377,550 A | 3/1983 | Tokarz |
| 4,984,904 A | 1/1991 | Nakano et al. |
| 5,517,594 A | 5/1996 | Shah et al. |
| 5,676,869 A | 10/1997 | Nakayama et al. |
| 7,946,762 B2 | 5/2011 | Yednak, III |
| 2005/0058179 A1 | 3/2005 | Phipps |
| 2005/0098107 A1 | 8/2005 | Du Bois |
| 2005/0287775 A1 | 12/2005 | Hasebe et al. |
| 2008/0289574 A1 | 11/2008 | Jacobs et al. |
| 2009/0014435 A1 | 1/2009 | Hayashida et al. |
| 2009/0029486 A1 | 1/2009 | Ueno et al. |
| 2009/0095422 A1 | 4/2009 | Sugishita et al. |
| 2009/0105867 A1 | 4/2009 | Yamaguchi |
| 2009/0111285 A1 | 4/2009 | Yamazaki et al. |
| 2011/0204036 A1 | 8/2011 | Murobayashi |

FOREIGN PATENT DOCUMENTS

| | | |
|---|---|---|
| JP | 09-097787 A | 4/1997 |
| JP | 2000-150404 A | 5/2000 |
| JP | 2004-311712 A | 11/2004 |
| JP | 2008-227363 A | 9/2008 |
| JP | 4557499 B2 | 7/2010 |
| JP | 2010-528291 A | 8/2010 |
| KR | 10-2006-0101591 | 9/2006 |
| KR | 10-2006-0110951 | 10/2006 |
| KR | 10-2012-0077837 | 7/2012 |
| WO | 2007/018142 A1 | 2/2007 |

FIG. 13A  FIG. 13B
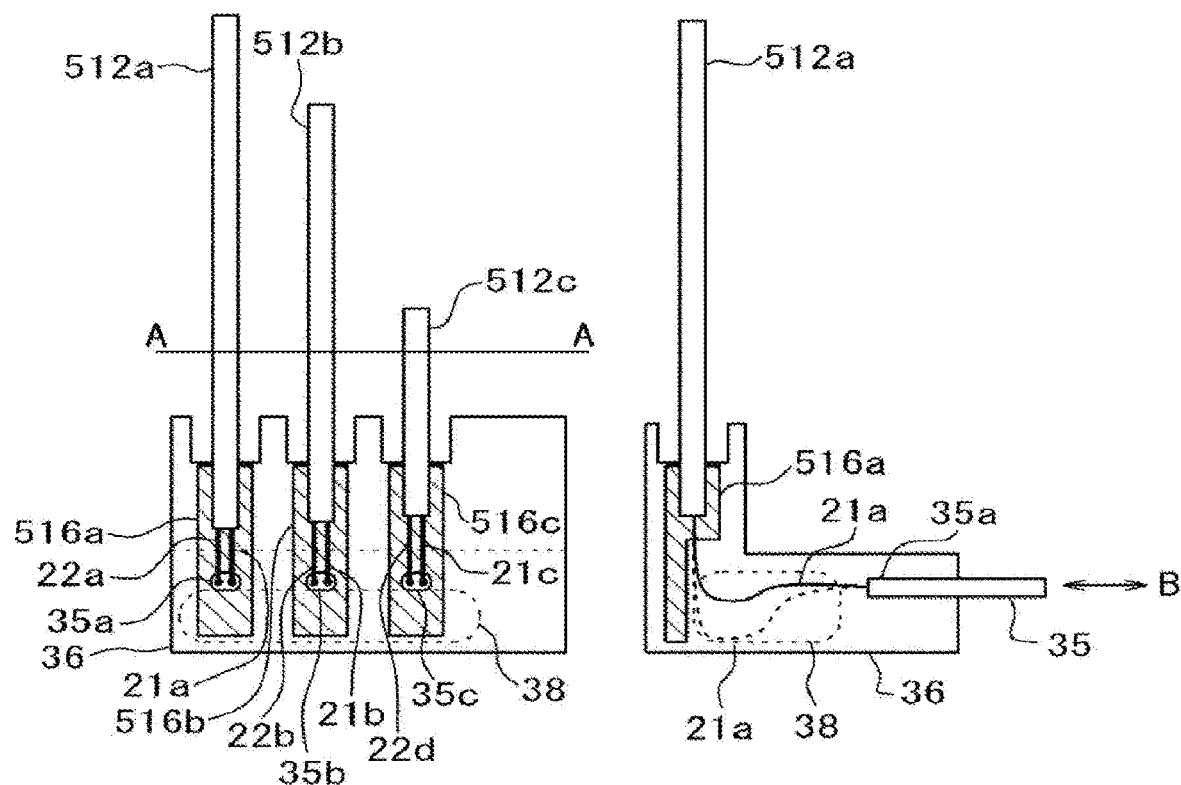
FIG. 14A  FIG. 14B  FIG. 14C
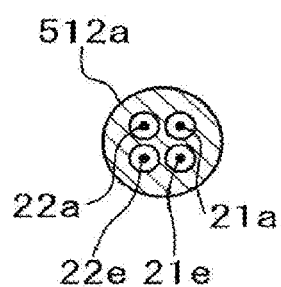 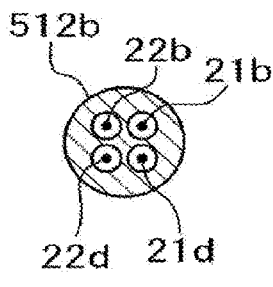 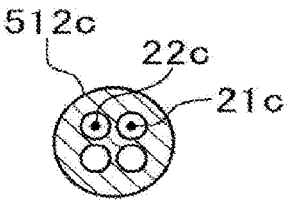

SUBSTRATE PROCESSING APPARATUS, METHOD OF MANUFACTURING SEMICONDUCTOR DEVICE, AND THERMOCOUPLE SUPPORT

CROSS REFERENCE TO RELATED APPLICATIONS

This application is a continuation of U.S. application Ser. No. 15/789,311, filed Oct. 20, 2017, which is a continuation of U.S. application Ser. No. 14/033,880, filed Sep. 23, 2013 which claims priority to Japanese Application No. 2012-210264 filed Sep. 25, 2012 all of which are incorporated herein as if fully set forth.

BACKGROUND

Technical Field

The present invention relates to heat treatment technology for accommodating a substrate in a processing chamber and processing the substrate while heating the substrate. For example, the present invention relates to a temperature detecting method, a substrate processing apparatus, a substrate processing method, and a semiconductor device manufacturing method, which are used to perform heat treatment, such as oxidation processing or diffusion processing, reflow processing or anneal processing for planarization or activation of carriers after ion implantation, film formation processing by thermal chemical vapor deposition (CVD) reaction, on a semiconductor substrate (for example, a semiconductor wafer) in which a semiconductor integrated circuit device (so-called semiconductor device, hereinafter referred to as IC) is formed.

Description of Related Art

In manufacturing an IC, a batch type vertical heat treatment apparatus is widely used in order to heat-treat a substrate. In a processing furnace of the heat treatment apparatus of the related art, a boat on which a plurality of wafers are mounted is inserted from a lower portion thereof in a vertical reaction tube of a substantially cylindrical shape with its upper end closed and its lower end open and the wafers mounted on the boat are heat-treated by a heater provided to surround an outside of the reaction tube. The plurality of wafers are in a horizontal posture on the boat, and stacked and held in a multi-stage with wafer centers aligned with each other.

Also, in the above heat treatment apparatus, a thermocouple (hereinafter referred to as heater thermocouple) is disposed between the reaction tube and a heater to measure a temperature inside the heater, and the heater is feedback-controlled based on the measured temperature. Also, as an apparatus preparation stage, an another thermocouple (hereinafter referred to as profile thermocouple) is disposed inside the reaction tube, and a temperature difference (hereinafter referred to as profile correction value) at the time when a measured temperature of the heater thermocouple and a measured temperature of the profile thermocouple become a normal state by feedback control of the heater is pre-recorded. In an apparatus operation state, the profile thermocouple is removed and the heater is controlled such that the measured temperature of the heater thermocouple becomes a target temperature reflecting the profile correction value, so that the temperature inside the reaction tube is controlled to a desired temperature.

However, since the heater thermocouple is disposed near the heater heating element but the profile thermocouple is disposed at a place close to a substrate inside the reaction tube, a long time of, for example, 30 minutes to one hour or more is required until the measurement temperature of the profile thermocouple becomes a normal state after the measured temperature of the heater thermocouple becomes a normal state. Therefore, in the apparatus operation state, a predetermined heat treatment is performed after a predetermined wait time from when the measured temperature of the heater thermocouple becomes the target temperature reflecting the profile correction value. Since the wait time is a factor determining the processing capacity of the apparatus, it is required that the wait time is as short as possible.

As a solution, a method is implemented which covers the profile thermocouple with a protection tube (hereinafter referred to as protection) formed of quartz or the like, continuously disposes the profile thermocouple inside the reaction tube even in the apparatus operation state, and performs direct feedback control such that the measured temperature of the profile thermocouple becomes a desired target temperature. However, this method has a problem of exerting a bad influence upon the heat treatment result because wastes are generated and periodic maintenance of the profile thermocouple is required since the protection of the profile thermocouple is heat-treated.

JP 2004-311712 A below discloses technology of installing a thermocouple for detecting a temperature of a processing furnace in a vertical heat treatment apparatus that includes a reaction tube and a heater.

SUMMARY

The present invention has been made in consideration of such actual circumstances, and provides a substrate processing apparatus, a semiconductor device manufacturing method, and a temperature detecting method, which can shorten a wait time until the start of a heat treatment even when a profile thermocouple is not used.
(Solution to the Problem)

According to one aspect of the present invention, there is provided a substrate processing apparatus including:

a reaction tube configured to accommodate a substrate holder holding a plurality of substrates and process a substrate held on the substrate holder;

a heating unit installed outside the reaction tube and configured to heat an inside of the reaction tube;

a protection installed in contact with an outer wall of the reaction tube;

an insulating tube disposed inside the protection and having through-holes therein;

a thermocouple having a thermocouple junction provided at an upper end thereof, and a first thermocouple wire and a second thermocouple wire joined at the thermocouple junction and inserted into the through-holes of the insulating tube;

a gas supply unit configured to supply a gas, for processing a substrate accommodated in the reaction tube, into the reaction tube; and an exhaust unit configured to exhaust a gas from the reaction tube.

According to another aspect of the present invention, there is provided a method of manufacturing a semiconductor device by using a substrate processing apparatus including: a reaction tube configured to accommodate a substrate holder holding a plurality of substrates and process a substrate held on the substrate holder; a heating unit installed outside the reaction tube and configured to heat an inside of the reaction tube; a protection installed in contact with an outer wall of the reaction tube; an insulating tube disposed inside the protection and having through-holes therein; a thermocouple having a thermocouple junction provided at an upper end thereof, and a first thermocouple wire and a second thermocouple wire joined at the thermocouple junction and inserted into the through-holes of the insulating tube; a gas supply unit configured to supply a process gas, for processing a substrate accommodated inside the reaction tube, into the reaction tube; and an exhaust unit configured to exhaust a gas from the reaction tube, the method including:

accommodating the substrate holder holding the plurality of substrates into the reaction tube;

heating the inside of the reaction tube by the heating unit;

detecting a temperature by using the thermocouple inserted into the insulating tube inside the protection;

supplying the process gas from the gas supply unit into the reaction tube;

processing the plurality of substrates on the substrate holder accommodated in the reaction tube, based on the temperature detected; and exhausting a gas from the reaction tube by the exhaust unit.

According to another aspect of the present invention, there is provided a temperature detecting method using a substrate processing apparatus including: a reaction tube configured to accommodate a substrate holder holding a plurality of substrates and process a substrate held on the substrate holder; a heating unit installed outside the reaction tube and configured to heat an inside of the reaction tube; a protection installed in contact with an outer wall of the reaction tube; an insulating tube disposed inside the protection and having through-holes therein; and a thermocouple having a thermocouple junction provided at an upper end thereof, and thermocouple wires joined at the thermocouple junction and inserted into the through-holes of the insulating tube, the temperature detecting method including:

heating the inside of the reaction tube by the heating unit; and detecting a temperature by using the thermocouple inserted into the insulating tube inside the protection. By the above configuration, the wait time until the start of a heat treatment can be shortened.

BRIEF DESCRIPTION OF THE DRAWINGS

FIGS. 13A and 13B are illustrating a state of a thermocouple lead portion according to the third embodiment of the present invention;

FIGS. 14A, 14B and 14C are horizontal sectional views of a thermocouple of FIGS. 13A and 13B.

DETAILED DESCRIPTION OF THE EMBODIMENTS

First Embodiment

As a first embodiment of the present invention, an example of a configuration of a substrate processing apparatus that implements a substrate processing process by a heat treatment as one process of a semiconductor device (such as IC) manufacturing process will be described with reference to FIG. 1.

Figure 1:
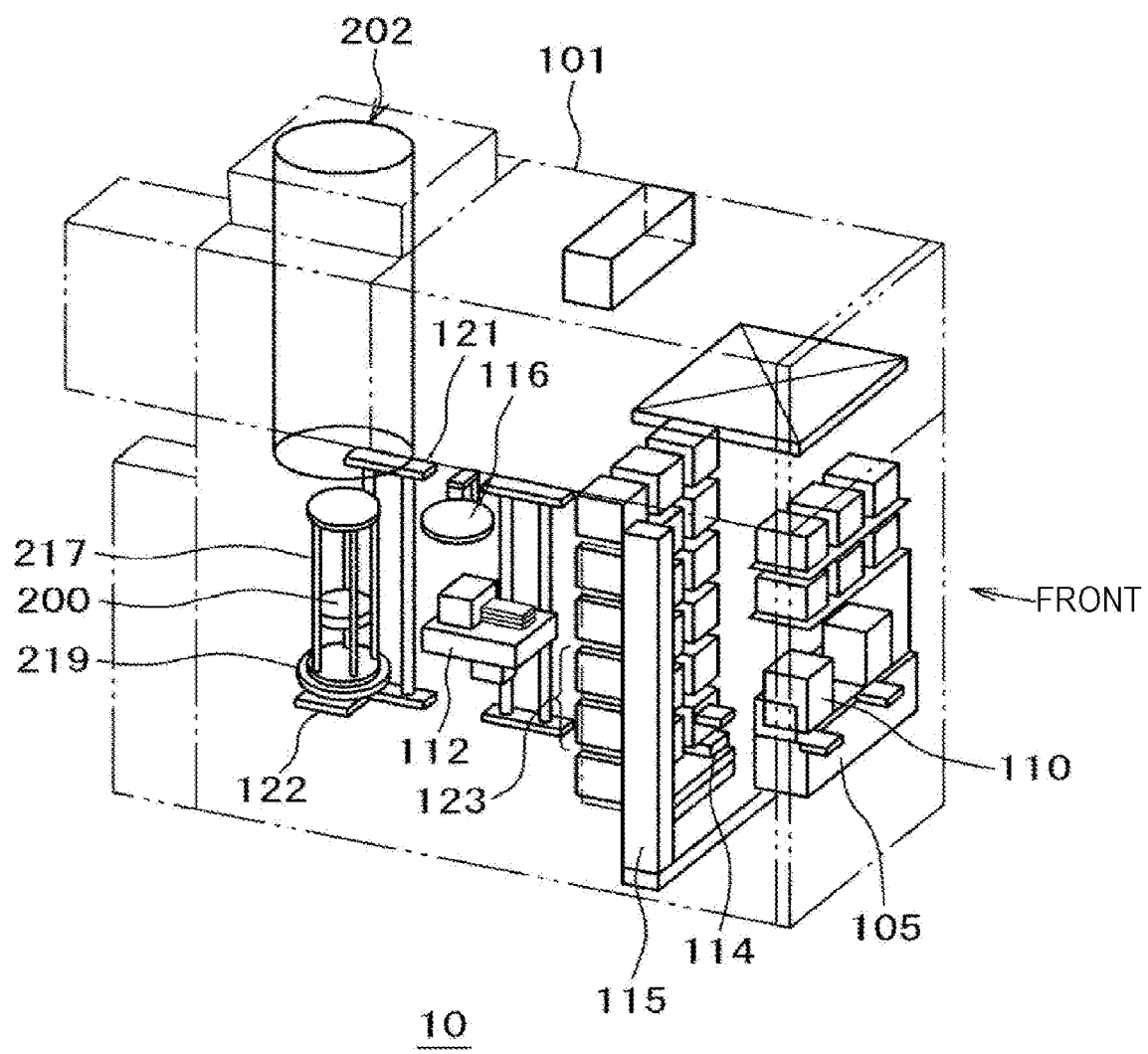
FIG. 1 is a perspective view of a substrate processing apparatus according to a first embodiment of the present invention.

FIG. 1 is a perspective view of a substrate processing apparatus according to a first embodiment of the present invention. As illustrated in FIG. 1, a substrate processing apparatus 10 according to the first embodiment includes a housing 101 and uses a cassette (pod, also referred to as FOUP) 110 as a wafer carrier (wafer container) to carry a wafer 200, which is a substrate formed of silicon or the like, into and away from the housing 101.

A cassette stage 105 is installed at a front side of the housing 101. By an in-process carrying device (not illustrated) outside the housing 101, the cassettes 110 are carried and placed onto the cassette stage 105 and carried away from the cassette stage 105 to the outside of the housing 101.

A cassette shelf 114 is installed at a substantially central portion inside the housing 101 in a front-back direction. The cassette shelf 114 stores a plurality of cassettes 110. A transfer shelf 123 is provided as a portion of the cassette shelf 114, and a cassette 110, which is transferred by a wafer transfer mechanism 112 which will be described later, is stored at the transfer shelf 123.

A cassette carrying device 115 is installed between the cassette stage 105 and the cassette shelf 114. The cassette carrying device 115 carries the cassette 110 between the cassette stage 105 and the cassette shelf 114 or the transfer shelf 123.

The wafer transfer mechanism 112 is installed at a rear side of the cassette shelf 114. The wafer transfer mechanism 112 accommodates the wafer 200 in the cassette 110 on the transfer shelf 123 by loading (charging) the wafer 200 in a boat 217 (substrate holder) to be described later, or unloading (discharging) the wafer 200 from the boat 217 after the wafer 200 is picked up from the cassette 110 on the transfer shelf 123.

A processing furnace 202 is provided at a rear upper side of the housing 101. A lower end portion of the processing furnace 202 is configured to be closed and opened by a furnace opening portion shutter 116. A configuration of the processing furnace 202 will be described later.

A boat elevator 121 is installed at a lower side of the processing furnace 202 as a carrying mechanism to carry the boat 217 to the inside or the outside of the processing furnace 202 by elevating the boat 217. An arm 122 is installed as an elevating stand on the boat elevator 121. A seal cap 219 is installed on the arm 122 in a horizontal posture. The seal cap 219 supports the boat 217 in a vertical direction and functions as a cover for tightly closing the lower end portion of the processing furnace 202 when the boat 217 is elevated by the boat elevator 121. A configuration of the boat 217 will be described later.

(Configuration of Processing Furnace)

Figure 2:
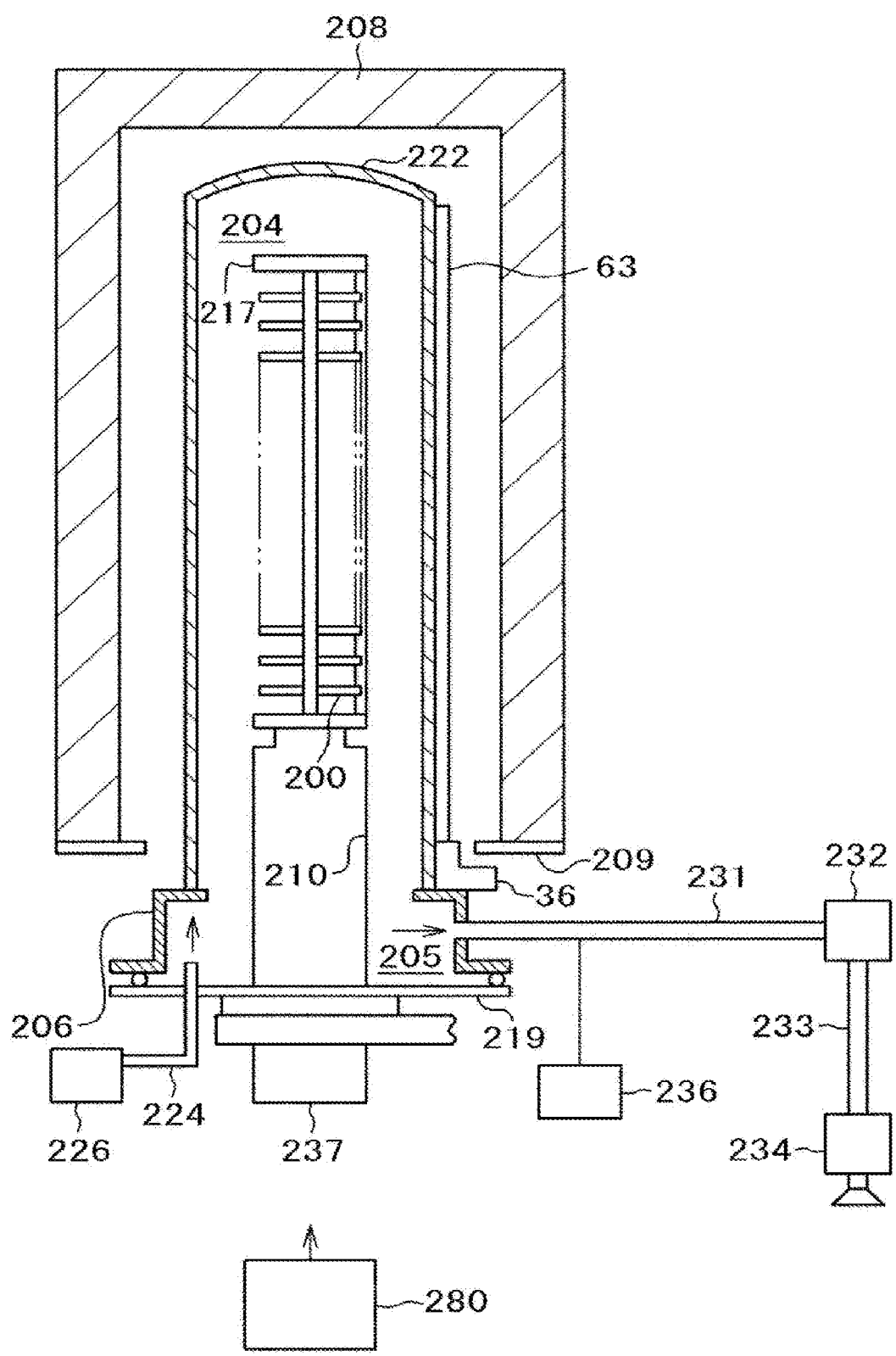
FIG. 2 is a vertical sectional view of a processing furnace according to the first embodiment of the present invention.

Subsequently, a configuration of the processing furnace 202 according to the embodiment of the present invention will be described with reference to FIG. 2. FIG. 2 is a vertical sectional view of a processing furnace of a substrate processing apparatus. In this embodiment, the processing furnace 202 is configured as a heat treatment furnace having a batch-type vertical hot wall form.

(Reaction Tube)

The processing furnace 202 includes a vertical-type reaction tube 222 at the inside of thereof. The reaction tube 222 has a substantially cylindrical shape with its upper end closed and its lower end open, and is disposed in a vertical direction such that the opened lower end faces the lower side and the central line of the cylindrical direction is vertical.

A processing chamber 204 is disposed in the reaction tube 222 to process a plurality of wafers 200 by accommodating the wafers 200, which are stacked in a multi-stage in the horizontal posture by the boat 217 as a substrate holder. An inner diameter of the reaction tube 222 is set to be larger than a maximum outer diameter of the boat 217 holding a group of the wafers 200.

In this example, the reaction tube 222 is integrally molded in a substantially cylindrical shape of a material having high heat resistance such as quartz ($SiO_2$) or silicon carbide (SiC).

A lower end portion of the reaction tube 222 is tightly sealed by a manifold 206 in which a horizontal cross section has a substantially circular ring shape. For maintenance work and cleaning work, the reaction tube 222 is detachably installed at the manifold 206. Since the manifold 206 is supported by the housing 101, the reaction tube 222 is installed in the housing 101 in the vertical direction. A lower end opening of the manifold 206 constitutes a furnace opening portion 205 for inserting or removing the boat 217 holding the group of the wafers 200.

At an outer side surface (outer wall) of the reaction tube 222, a protection 63 containing and protecting a thermocouple as a temperature measuring element is installed to extend in the vertical direction. A lower end of the protection 63 is supported and fixed by a protection tube holder 36. The protection 63 is formed of a material having high heat resistance, such as silicon carbide (SiC). The protection tube holder 36 is formed of alumina, stainless, or the like and includes a vertical portion supporting the protection 63, and a horizontal portion into which a thermocouple wire is inserted and guided to the outside of the processing chamber 204. Details of the thermocouple and protection 63 will be described later.

(Substrate Holder)

The manifold 206 is in contact with a seal cap 219 for closing the lower end opening of the manifold 206, from a vertical lower side. The seal cap 219 is formed in a disk shape having an outer diameter equal to or greater than that of the reaction tube 222 and configured to be elevated in the vertical direction, while the disk shape is maintained in the horizontal posture by the boat elevator 121 installed at the outside of the reaction tube 222 in the vertical direction.

The boat 217 as the substrate holder holding the wafers 200 is supported on the seal cap 219 in the vertical direction. The boat 217 includes a pair of top and bottom end plates and a plurality of, in this example, three wafer holding members (boat prop) installed across both of the plates in the vertical direction. The end plates and the wafer holding members are formed of, for example, a material having high heat resistance, such as quartz ($SiO_2$) or silicon carbide (SiC).

A plurality of holding grooves engraved in the horizontal direction are provided in each wafer holding member at regular intervals across the longitudinal direction. Each wafer holding member is provided such that holding grooves face each other and vertical positions (vertical direction positions) of the holding groove of each wafer holding member are matched. The peripheries of the wafer 200 are inserted into the holding grooves of the same stage in the plurality of wafer holding members and thus, the plurality of wafers 200 (for example, about 50 to 150) are in a horizontal posture and stacked and held in a multi-stage and in a vertical direction in a state in which centers of the wafers are aligned with each other.

In addition, a heat insulating cylinder 210 is provided between the boat 217 and the seal cap 219. The heat insulating cylinder 210 is formed of, for example, a material having high heat resistance, such as quartz ($SiO_2$) or silicon carbide (SiC). By the heat insulating cylinder 210, transmission of heat from a heater unit 208, which will be described later, to the manifold 206 is suppressed.

A boat rotation mechanism 237 rotating the boat 217 is provided on a lower side (on the opposite side of the processing chamber 204) of the seal cap 219. A boat rotation shaft of the boat rotation mechanism 237 supports the boat 217 from the lower side through the seal cap 219. By rotating the boat rotation shaft, the wafers 200 can be rotated in the processing chamber 204. The seal cap 219 is configured to be elevated by the above-described boat elevator 121 in the vertical direction, and thus the boat 217 can be carried to the inside and outside of the processing chamber 204.

The boat rotation mechanism 237 and the boat elevator 121 are electrically connected to a control unit (controller) 280. The control unit 280 controls the boat rotation mechanism 237 and the boat elevator 121 such that the boat rotation mechanism 237 and the boat elevator 121 perform desired operations at desired timing.

(Heater Unit)

The heater unit 208, as a heating unit which entirely heats the inside of the reaction tube 222 uniformly or at a predetermined temperature distribution, is provided outside the reaction tube 222 to surround the reaction tube 222. The heater unit 208 is vertically installed by being supported on the housing 101 of the substrate processing apparatus 10, and configured to include, for example, a resistance heating heater such as a carbon heater.

(Gas Supply System)

A gas supply system will be described with reference to FIG. 2. As illustrated in FIG. 2, a gas nozzle 224 supplying a processing gas into the processing chamber 204 is provided to penetrate the seal cap 219 in the vertical direction. Also, the gas nozzle 224 may be provided to penetrate the manifold 206 in the horizontal direction. A processing gas supply mechanism 226 is connected to the gas nozzle 224. The processing gas supply mechanism 226 includes a processing gas supply source supplying the processing gas, a mass flow controller (MFC) as a flow control device, and an opening/closing valve, in order from the upstream side. A processing gas supply unit is mainly configured to include the gas nozzle 224. Also, the processing gas supply mechanism 226 may be included in the processing gas supply unit.

The MFC or opening/closing valve of the processing gas supply mechanism 226 is electrically connected to the control unit 280. The control unit 280 controls the MFC and the opening/closing valve such that a type of gas to be supplied into the processing chamber 204 may be supplied as a desired gas species at a desired timing, and may flow at a desired flow rate at a desired timing.

(Gas Exhaust System)

An exhaust pipe 231 exhausting an atmosphere inside the processing chamber 204 is connected to a portion of a sidewall of the manifold 206. A pressure sensor 236 as a pressure detector, and an auto pressure controller (APC) valve 232 as a pressure regulator, are provided at the exhaust pipe 231 in order from the upstream side. A vacuum pump 234 is connected to a downstream of the APC valve 232 through an exhaust pipe 233 as a vacuum exhaust device. An exhaust portion exhausting gas from the reaction tube 222 is mainly configured to include the exhaust pipe 231. Also, the APC valve 232 and the vacuum pump 234 may be included in the exhaust portion.

The APC valve 232 and the pressure sensor 236 are electrically connected to the control unit 280. The control unit 280 controls an opening degree of the APC valve 232 such that a pressure inside the processing chamber 204 becomes a desired pressure at a desired timing, based on pressure values detected by the pressure sensor 236.

(Controller)

The control unit 280 includes an operation unit or an input/output unit (not illustrated), and is electrically connected to each component of the substrate processing apparatus 10 to control each component of the substrate processing apparatus 10. The control unit 280 commands temperature control or pressure control, flow control and mechanical driving control based on a recipe that represents a control sequence of a process such as a film forming process on a time axis.

(Temperature Detecting Apparatus)

Figure 3:
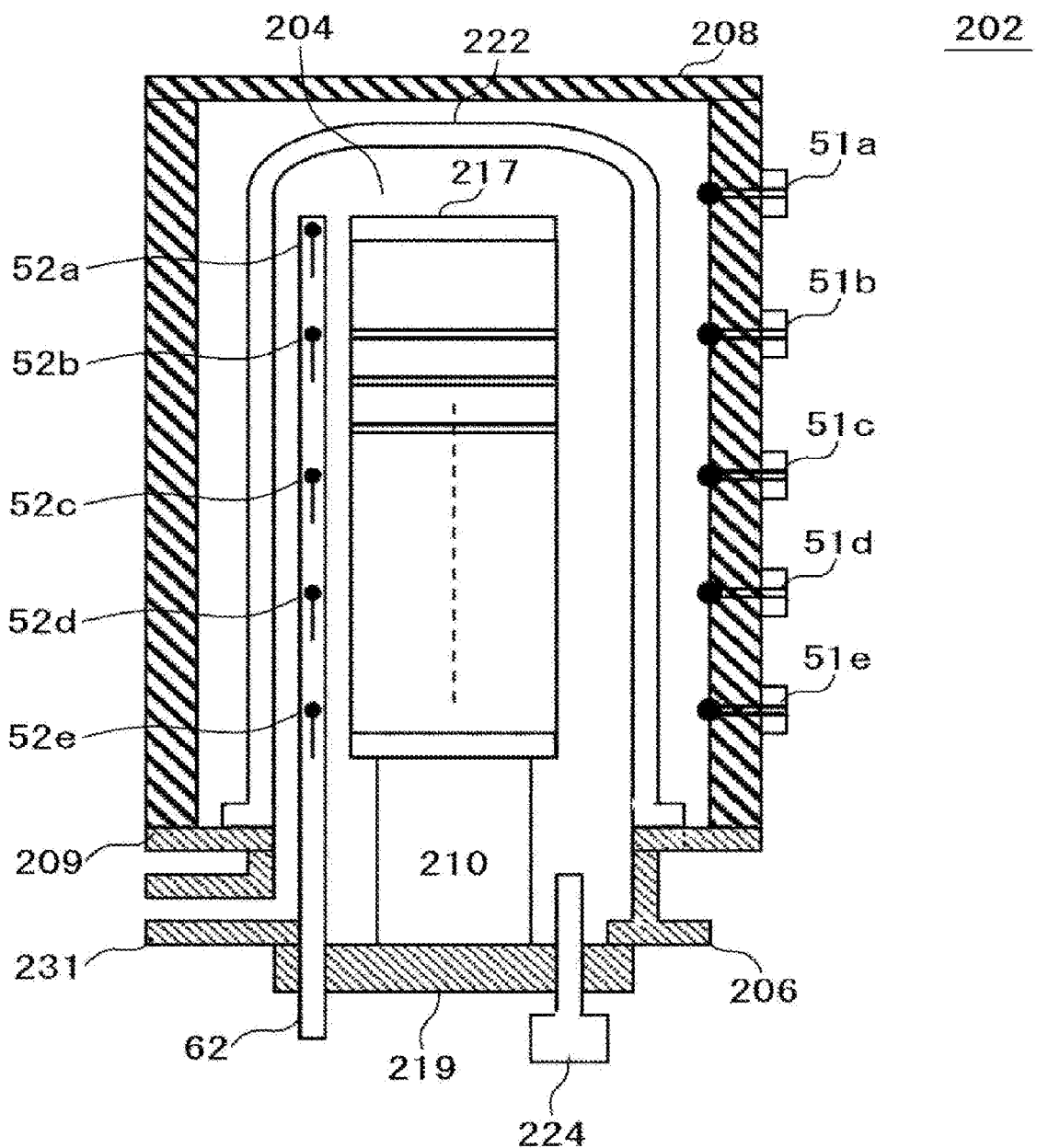
FIG. 3 is a vertical sectional view of a processing furnace according to the first embodiment of the present invention.
Figure 4:
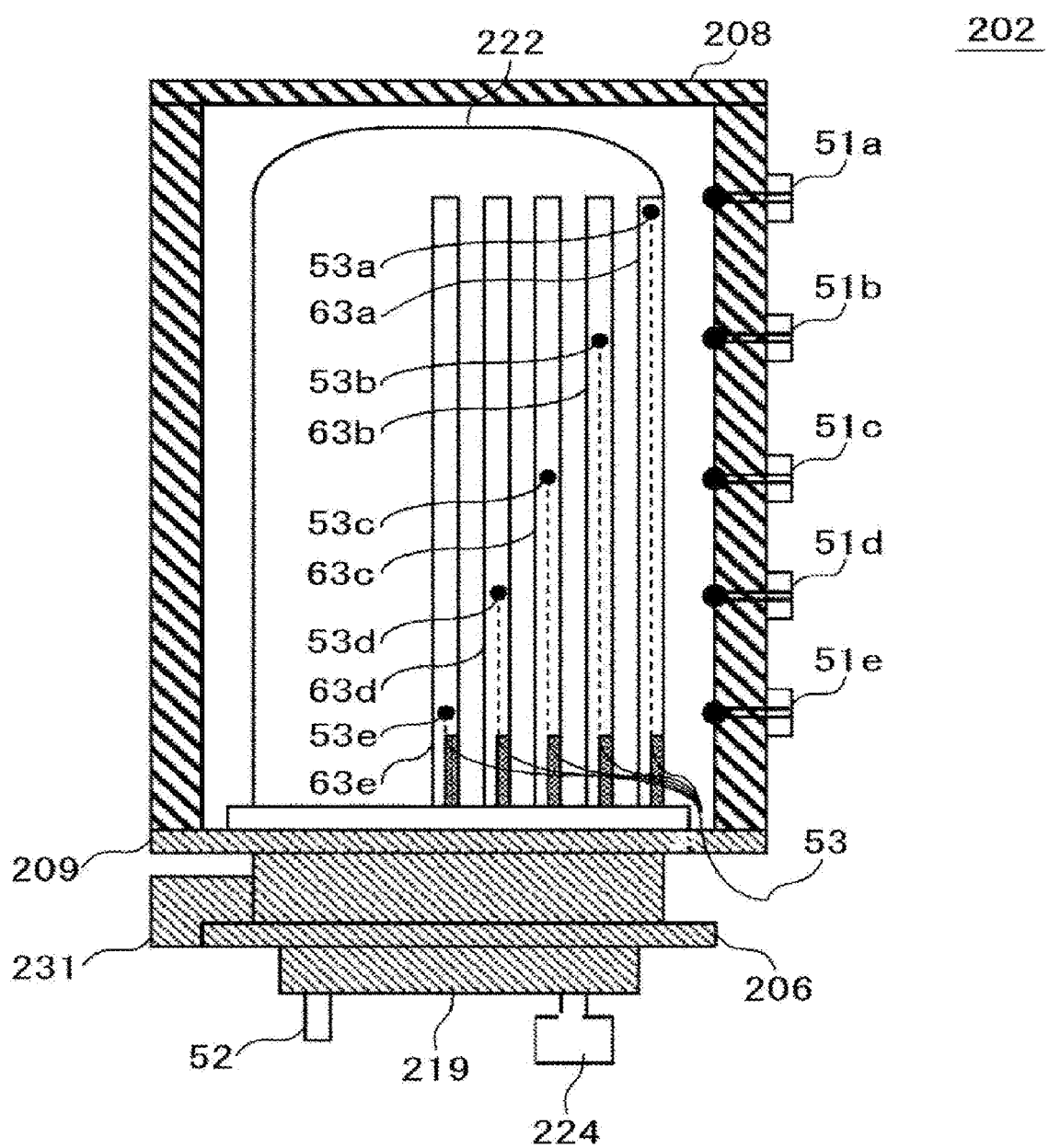
FIG. 4 is a view illustrating a processing furnace and a thermocouple according to the first embodiment of the present invention.
Figure 5:
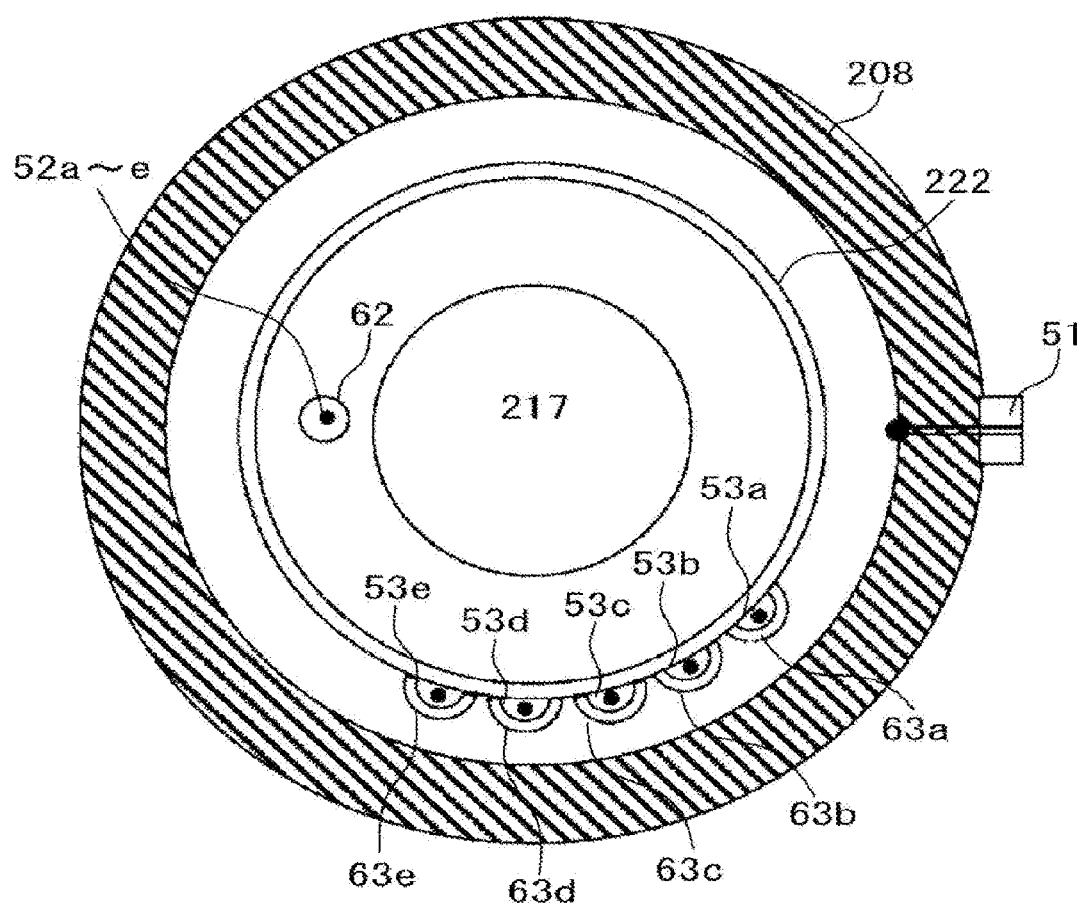
FIG. 5 is a horizontal sectional view of the processing furnace of FIG. 4.

A temperature detecting apparatus according to the first embodiment will be described in brief with reference to FIGS. 3 to 5. FIGS. 3 and 4 vertical sectional views of a processing furnace according to the first embodiment. For easy understanding, in FIG. 3, a heater thermocouple and a profile thermocouple are illustrated, but illustration of a reaction tube thermocouple is omitted. Also, in FIG. 4, a heater thermocouple and a reaction tube thermocouple are illustrated, but illustration of a profile thermocouple is omitted. FIG. 5 is a horizontal sectional view of the processing furnace of FIG. 4.

As illustrated in FIG. 3, heater thermocouples 51a to 51e are provided near the heater unit 208 to vertically penetrate the heater unit 208 provided to surround the reaction tube 222, and a thermocouple junction portion (hereinafter simply referred to as junction) of each of the heater thermocouples 51a to 51e faces an outer side surface of the reaction tube 222. Each wire of the heater thermocouples 51a to 51e extends to the outside of the heater unit 208 and is connected to the control unit 280. The heater thermocouples 51a to 51e may be represented and referred to as heater thermocouple 51.

Also, as illustrated in FIG. 3, profile thermocouples 52a to 52e are accommodated in a profile thermocouple protection 62 that is provided to penetrate the seal cap 219 in the vertical direction.

The profile thermocouples 52a to 52e are installed in a preparation state of the substrate processing apparatus 10 to acquire a profile correction value. The profile thermocouples 52a to 52e are removed in an operation state of the substrate processing apparatus 10.

The heater unit 208 is divided into a plurality of heating zones. In an example of FIG. 3, the heater unit 208 is divided into five heating zones. The thermocouples 51a and 52a are used to detect the temperature of an uppermost heater (U-zone heater) of the processing furnace; the thermocouples 51b and 52b are used to detect the temperature of a heater (CU-zone heater) directly under the U-zone heater; thermocouples 51c and 52c are used to detect the temperature of a heater (C-zone heater) directly under the CU-zone heater; thermocouples 51d and 52d are used to detect the temperature of a heater (CL-zone heater) directly under the C-zone heater; and thermocouples 51e and 52e are used to detect the temperature of a lowermost heater (L-zone heater) of the processing furnace.

The measured temperatures of the heater thermocouples 51a to 51e are feedback-controlled independently of or in association with the respective divided elements (heating zones). Based on the measured temperatures of the profile thermocouples 52a to 52e, the heating amount of the heater unit 208 is controlled such that the difference between a target temperature and the measured temperature of the heater thermocouples 51a to 51e and reaction tube thermocouples 53a to 53e, which will be described later, is reduced.

Also, without using the heater thermocouples 51a to 51e, the reaction tube thermocouples 53a to 53e may be used to control the heating amount of the heater unit 208 to reduce the difference between the target temperature and the measured temperature of the reaction tube thermocouples 53a to 53e, and without using the heater thermocouples 51a to 51e and the profile thermocouples 52a to 52e, the reaction tube thermocouples 53a to 53e may be used to control the heating amount of the heater unit 208 to reduce the difference between the target temperature and the measured temperature of the reaction tube thermocouples 53a to 53e.

As illustrated in FIGS. 4 and 5, the reaction tube thermocouples 53a to 53e are installed in spaces between the outer wall of the reaction tube 222 and the inner walls of reaction tube thermocouple protections 63a to 63e to measure the temperatures of the spaces (hereinafter referred to as reaction tube thermocouple space). Five reaction tube thermocouples 53a to 53e are installed corresponding to the divided heaters (U-zone to L-zone).

The reaction tube thermocouple protections 63a to 63e are protections that are formed of quartz and have a cross section of a semicircular tubular shape. The reaction tube thermocouple protections 63a to 63e are in contact with the outer wall of the reaction tube 222 in the vertical direction. The reaction tube thermocouple protections 63a to 63e are mechanically fixed by, for example, welding or key pins. The reaction tube thermocouple protections 63a to 63e constitute the reaction tube thermocouple space, form a portion of the reaction tube 222, and accommodate the reaction tube thermocouples 53a to 53e. The thickness of the wall portions of the reaction tube thermocouple protections 63a to 63e is substantially equal to the thickness of the reaction tube 222, and is, for example, 10 mm. Also, the reaction tube thermocouple protections 63a to 63e is not limited to having a cross section of a semicircular tubular shape, and may have any shape for constituting the reaction tube thermocouple space.

Figure 6:
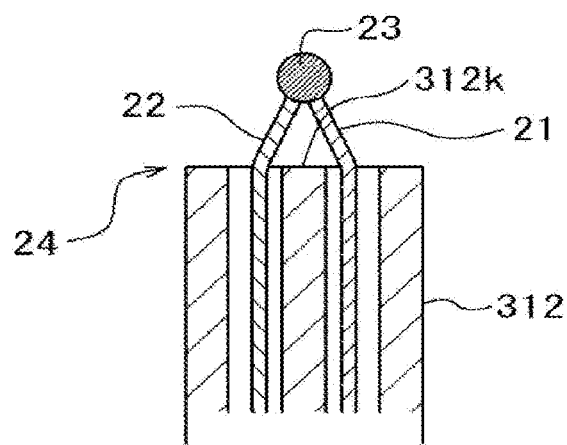
FIG. 6 is a view illustrating an example of a thermocouple support structure according to the first embodiment of the present invention.

A support structure of the reaction tube thermocouples 53a to 53e will be described with reference to FIGS. 6 and 7. FIG. 6 illustrates an example of the thermocouple support structure according to the first embodiment, and FIG. 7 illustrates another example of the thermocouple support structure according to the first embodiment.

In the example of FIG. 6, an upper end of a thermocouple wire 21 and an upper end of a thermocouple wire 22 are supported by a thermocouple wire support portion 24. The thermocouple wire support portion 24 is an upper end 312k of a wall portion between two through-holes provided at an insulating tube 312 to penetrate the thermocouple wires 21 and 22, and is, for example, an upper end of a wall portion between two through-holes at a cut portion 310 of FIG. 8, which will be described later. The insulating tube 312 electrically insulates the thermocouple wires 21 and 22 penetrating two through-holes.

By this configuration, in thermal expansion, the thermocouple wire 21 and the thermocouple wire 22 can maintain a linear shape by their own weight, and can be suppressed from being partially curved or receiving a binding force. Accordingly, it is possible to suppress the generation of a strong frictional force between the insulating tube 312 and the thermocouple wires 21 and 22.

Figure 7:
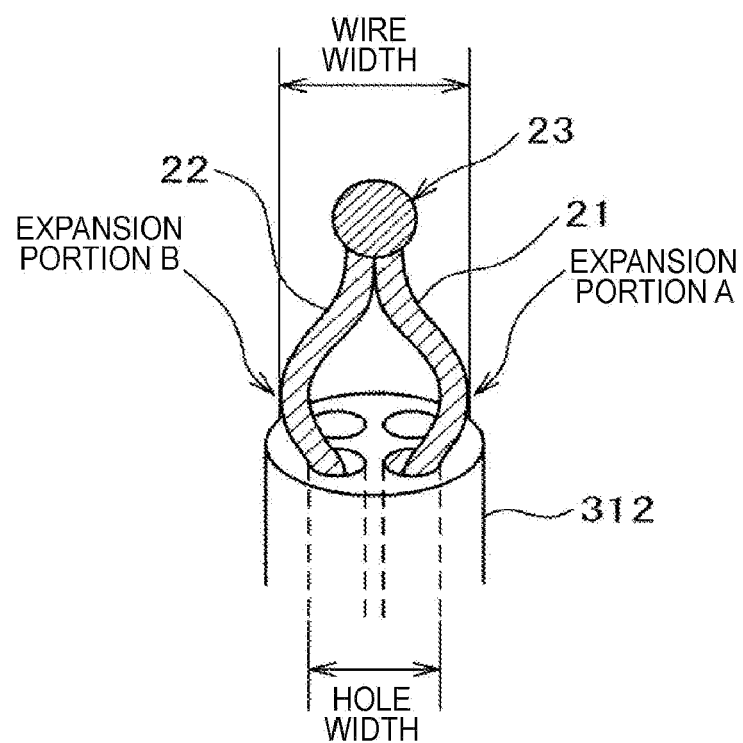
FIG. 7 is a view illustrating another example of a thermocouple support structure according to the first embodiment of the present invention.

In the example of FIG. 7, substantially directly under a thermocouple junction 23, a thermocouple wire 21 and a thermocouple wire 22 are curved to expand to the outside, and thus an expansion portion A and an expansion portion B expanding to the outside in the horizontal direction are formed at the thermocouple wire 21 and the thermocouple wire 22, respectively. A wire width formed by the expansion portion A and the expansion portion B is set to be larger than a hole width formed by two through-holes into which the thermocouple wire 21 and the thermocouple wire 22 are inserted.

Herein, the wire width is the maximum distance formed by the outer edges of the expansion portions A and B of two thermocouple wires joined at the thermocouple junction 23 over the upper end of the insulating tube 312 (for example, the upper end of a wall portion between two through-holes in the cut portion 310 of FIG. 8, which will be described later), that is, the distance of the longest straight line among the lines connecting the outer edges of two thermocouple wires between the thermocouple junction 23 and the upper end surface of the insulating tube 312 in the horizontal direction. The hole width is the longest diameter of an ellipse including two through-holes into which the thermocouple wire 21 and the thermocouple wire 22 are inserted, and is the distance of the longest straight line among the lines connecting the outer edges (circumferences in the example of FIG. 7) of the two through-holes, specifically, the distance of the longest straight line among the lines horizontally connecting the circumferences of two circles formed by the horizontal cross sections of the two through-holes at the upper end of the insulating tube 312.

In this manner, since the wire width near the thermocouple junction 23 is greater than the hole width, the outer edges of the thermocouple wire 21 and the thermocouple wire 22 are caught on the circumferential portions of two through-holes at the upper end of the insulating tube 312, that is, supported by the upper end surface of the insulating tube 312.

Also, in the example of FIG. 7, the expansion portion of the thermocouple wire is gently curved; however, it is not limited thereto and may be bent at a right angle, for example.

Also, in the example of FIG. 7, an expansion portion is formed at a thermocouple wire and the thermocouple wire is supported at the upper end of the insulating tube by the expansion portion; however, a supported body that is horizontally longer than the hole width formed by two through-holes into which the thermocouple wire 21 and the thermocouple wire 22 are inserted may be provided at the thermocouple wire between the upper end surface of the insulating tube and the thermocouple junction. The supported body may be configured, for example, by adhering a rod-shaped body formed of alumina to the thermocouple wire 21 and the thermocouple wire 22 by an adhesive. Even in this case, like the configuration in which an expansion portion is formed at the thermocouple wire, the force applied to the thermocouple junction can be reduced.

Also, instead of forming an expansion portion at the thermocouple, by reducing the distance between two thermocouple wires than the minimum length connecting the outer edges of two through-holes, the thermocouple wire can also be supported at the upper end surface of the insulating tube.

Also, by screwing or twisting two thermocouple wires, the thermocouple wire can also be supported at the upper end surface of the insulating tube. In this case, two thermocouple wires are insulated therebetween so that the two thermocouple wires are not electrically shorted.

Subsequently, a structure of the reaction tube thermocouple according to the first embodiment will be described with reference to FIG. 8. FIG. 8 is a view illustrating a reaction tube thermocouple support structure according to the first embodiment of the present invention. FIG. 8(a) is a view illustrating a configuration of a specific example of a reaction tube thermocouple support structure 300 according to the first embodiment; FIG. 8(b) is a front view of a cut portion 310 to be described later; FIG. 8(c) is a side view of the cut portion 310; and FIG. 8(d) is a schematic view illustrating the attachment of the reaction tube thermocouple support structure 300 to the reaction tube 222.

Figure 8:
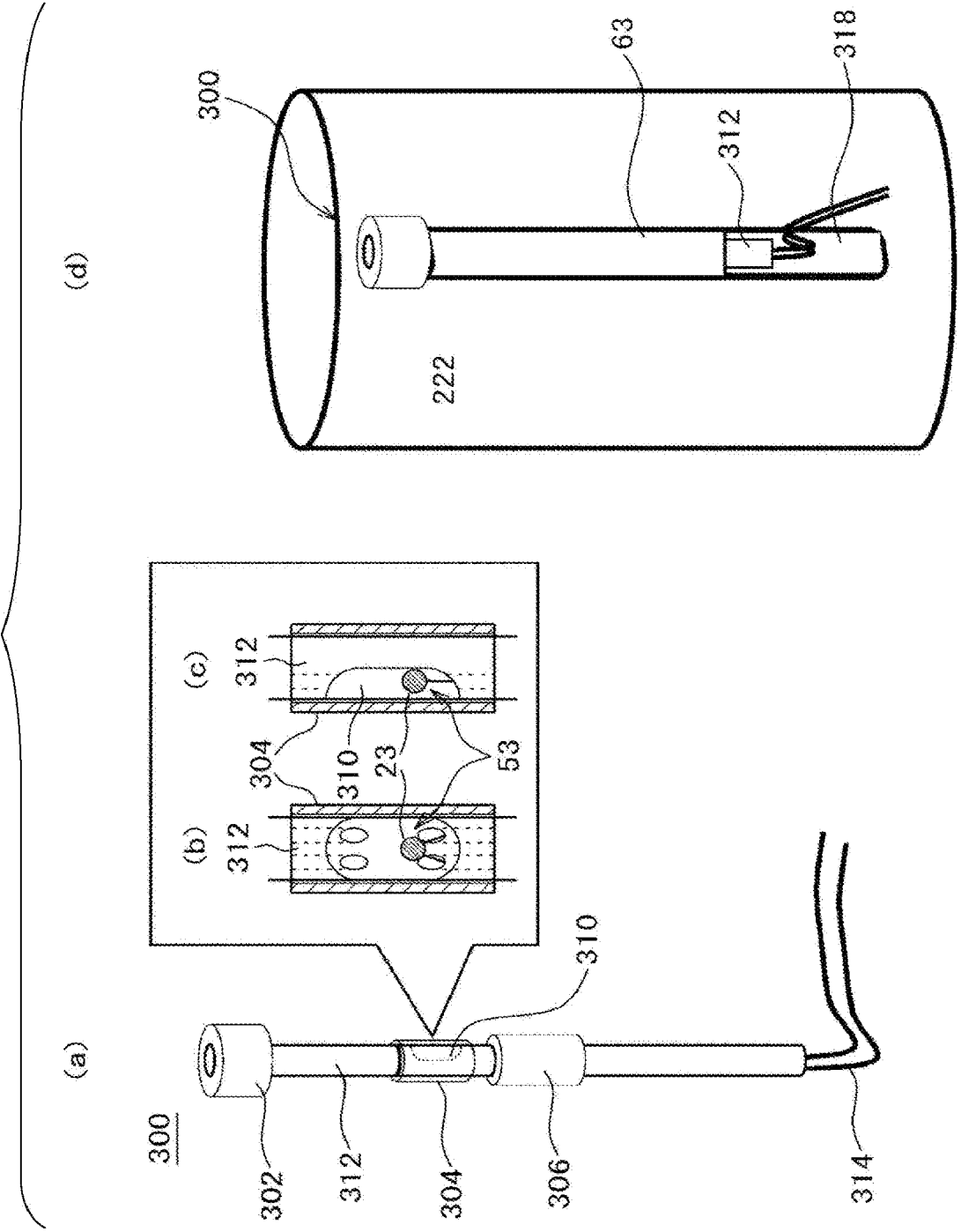
FIG. 8 is a view illustrating a reaction tube thermocouple support structure according to the first embodiment of the present invention.

In the example of FIG. 8, the reaction tube thermocouple support structure 300 includes a reaction tube thermocouple 53, an insulating tube 312 having a cut portion 310, a cover 304 covering the cut portion 310, a cap 302, and a spacer 306. Also, the temperature detecting apparatus includes a reaction tube thermocouple support structure 300, a reaction tube thermocouple protection 63, and a reaction tube 222.

The reaction tube thermocouple 53 includes a thermocouple junction 23, and two thermocouple wires (plus line and minus line) joined at a thermocouple junction 23. For example, the plus line is formed of platinum rhodium, and the minus line is formed of platinum.

As illustrated in FIGS. 8(b) and 8(c), the insulating tube 312 is a circular tube that is formed of alumina and has at least two (for example, two) holes having an inner diameter into which two thermocouple wires of the reaction tube thermocouple 53 can be inserted.

The cut portion 310 is formed by removing a central portion of the insulating tube 312 from the side surface. The cut portion 310 has a space for exposing two holes inside the insulating tube 312, inserting the thermocouple wire of the reaction tube thermocouple 53 from the holes, and including the junction 23 of the reaction tube thermocouple 53.

The cap 302 is a cylindrical or circular tube formed of alumina, is adhered and fixed to a top (upper leading end) of the insulating tube 312 by, for example, a ceramic-based adhesive, and constitutes a leading end of the reaction tube thermocouple support structure 300. An outer diameter of the cap 302 is greater than the diameter of the reaction tube thermocouple space in the horizontal direction.

The cover 304 is a circular tube-shaped cover formed of alumina. After inserting the thermocouple wire of the reaction tube thermocouple 53 into the hole of the insulating tube 312, by accommodating the junction 23 of the reaction tube thermocouple 53 in the internal space of the cut portion 310, the cover 304 is adhered and installed at the outside of the insulating tube 312 by, for example, a ceramic-based adhesive. Accordingly, the cover 304 protects the junction 23 of the reaction tube thermocouple 53. The thickness of the cover 304 is set such that the outer diameter of the cover 304 is smaller than the outer diameter of the spacer 306.

The spacer 306 is provided under the cover 304. The spacer 306 is an alumina circular tube that is adhered to the outside of the insulating tube 312 by, for example, a ceramic-based adhesive. The outer diameter of the spacer 306 is set to be slightly smaller than the diameter (inner diameter) of the reaction tube thermocouple space in the horizontal direction. Accordingly, in a state in which the reaction tube thermocouple support structure 300 is installed in the reaction tube thermocouple space, the junction 23 of the reaction tube thermocouple 53 is located at a substantially central position of the horizontal cross section of the reaction tube thermocouple space, and the cover 304 does not contact the outer wall of the reaction tube 222 and the inner wall of the reaction tube thermocouple protection 63, by vibration or the like.

In this manner, the junction 23 of the reaction tube thermocouple 53 is located in the internal space of the cut portion 310. Also, the plus line and the minus line of the thermocouple wire are respectively inserted into two holes of the insulating tube 312 under the cut portion 310, and are extracted as a thermocouple lead portion 314 from the bottom surface of the insulating tube 312. At the thermocouple lead portion 314, the plus line and the minus line are covered with heat-resistance insulating tubes such that they are not in contact with each other.

As illustrated in FIG. 8(d), the reaction tube thermocouple support structure 300 is inserted into the reaction tube thermocouple space and is supported with the bottom surface of the cap 302 caught on the upper surface of the reaction tube thermocouple protection 63.

Also, a lead portion extraction window 318 is provided at a lower end portion of the reaction tube thermocouple protection 63, and the thermocouple lead portion 314 is extracted therefrom.

(Substrate Processing Operation According to this Embodiment)

Subsequently, a substrate processing operation according to this embodiment will be described with an example of a film forming process in an IC manufacturing method. The substrate processing operation is controlled by the controller 280. First, in a wafer charging step, a wafer 200 is loaded on the boat 217. In the state of being loaded on the boat 217, a plurality of wafers 200 are stacked and arranged horizontally in a multi-stage in parallel to each other with their centers aligned with each other.

Subsequently, in a boat loading step, the boat 217 loaded with and holding the plurality of wafers 200 are carried into the processing chamber 204 (boat loading). Subsequently, a depressurizing step, the inside of the reaction tube 222 is depressurized to a predetermined vacuum level through the exhaust pipe 231 by the vacuum pump 234, and the temperature of the inside of the reaction tube 222 is increased to a predetermined temperature by the heater unit 208 based on the temperatures measured by the temperature detecting apparatus.

Subsequently, in a film forming step, the boat 217 is rotated, and a predetermined raw material is supplied to the gas nozzle 224 and introduced into the processing chamber 204. The raw material gas introduced into the processing chamber 204 is discharged into the reaction tube 222 and exhausted from the exhaust pipe 231 provided at the manifold 206. In the film forming step, based on the temperatures measured by the temperature detecting apparatus, the inside of the reaction tube 222 is maintained at a predetermined temperature by the heater unit 208. Accordingly, by the raw material gas flowing in parallel to the space between the wafer 200 and the wafer 200 vertically adjacent to each other while contacting the surface of the wafer 200, a film is formed on the surface of the wafer 200.

After desired film forming processing is completed, the supply of a raw material gas is stopped, and the inside of the processing chamber 204 is returned to an atmospheric pressure by an inert gas. Also, the temperature of the inside of the reaction tube 222 is increased to a predetermined temperature based on the temperatures measured by the temperature detecting apparatus. Subsequently, in a boat unloading step, by lowering the seal cap 219, the lower end of the processing chamber 204 is opened, and a group of wafers 200 held by the boat 217 is carried away from the processing chamber 204 to the outside (boat unloading).

The above-described temperature-increasing, temperature-maintaining, and temperature-decreasing operations are controlled by the controller 280 based on the temperatures measured by the reaction tube thermocouple (for example, known PID control) such that the measured temperature becomes the target temperature.

According to the first embodiment, at least the following effects A1 to A5 can be obtained.

A1) Since the reaction tube thermocouple protection tube is provided in contact with the outer wall of the reaction tube and the reaction tube thermocouple is disposed therein, the temperature characteristics of the reaction tube thermocouple can be approached to the temperature characteristics of the profile thermocouple. Accordingly, in actual operation, even when the profile thermocouple is not used, the wait time until the start of the heat treatment can be shortened, or the temperature in the reaction tube can be measured more accurately.

(A2) Since two through-holes are provided at one insulating tube, a pair of reaction tube thermocouples are inserted into the through-holes, and only one insulating tube is disposed in one reaction tube thermocouple protection tube, the outer diameter of the reaction tube thermocouple protection tube can be reduced. Accordingly, it is easy to install the reaction tube thermocouple protection tube at the outer wall of the reaction tube, that is, in the space between the reaction tube and the heater unit.

(A3) Since the cap is provided at the upper end of the insulating tube and the bottom surface of the cap is supported by the top surface of the reaction tube thermocouple protection tube, the insulating tube can be easily replaced and maintenance works such as replacing or cleaning of the reaction tube thermocouple can be easily performed.

(A4) Since the junction of the reaction tube thermocouple is accommodated in the cut portion of the insulating tube and the cut portion is covered with the cover, the junction can be prevented from being damaged by contacting the reaction tube thermocouple protection tube.

(A5) Since the spacer is provided under the cut portion, and the outer diameter of the spacer is greater than the outer diameter of the cover of the cut portion and is smaller than the inner diameter of the reaction tube thermocouple space (the space surrounded by the outer wall of the reaction tube and the reaction tube thermocouple protection tube), the junction of the reaction tube thermocouple can be supported and located at a substantially central portion of the horizontal cross section of the reaction tube thermocouple space, and the cover can be protected by preventing the cover from contacting the outer wall of the reaction tube and the inner wall of the reaction tube thermocouple protection tube.

Second Embodiment

Figure 9:
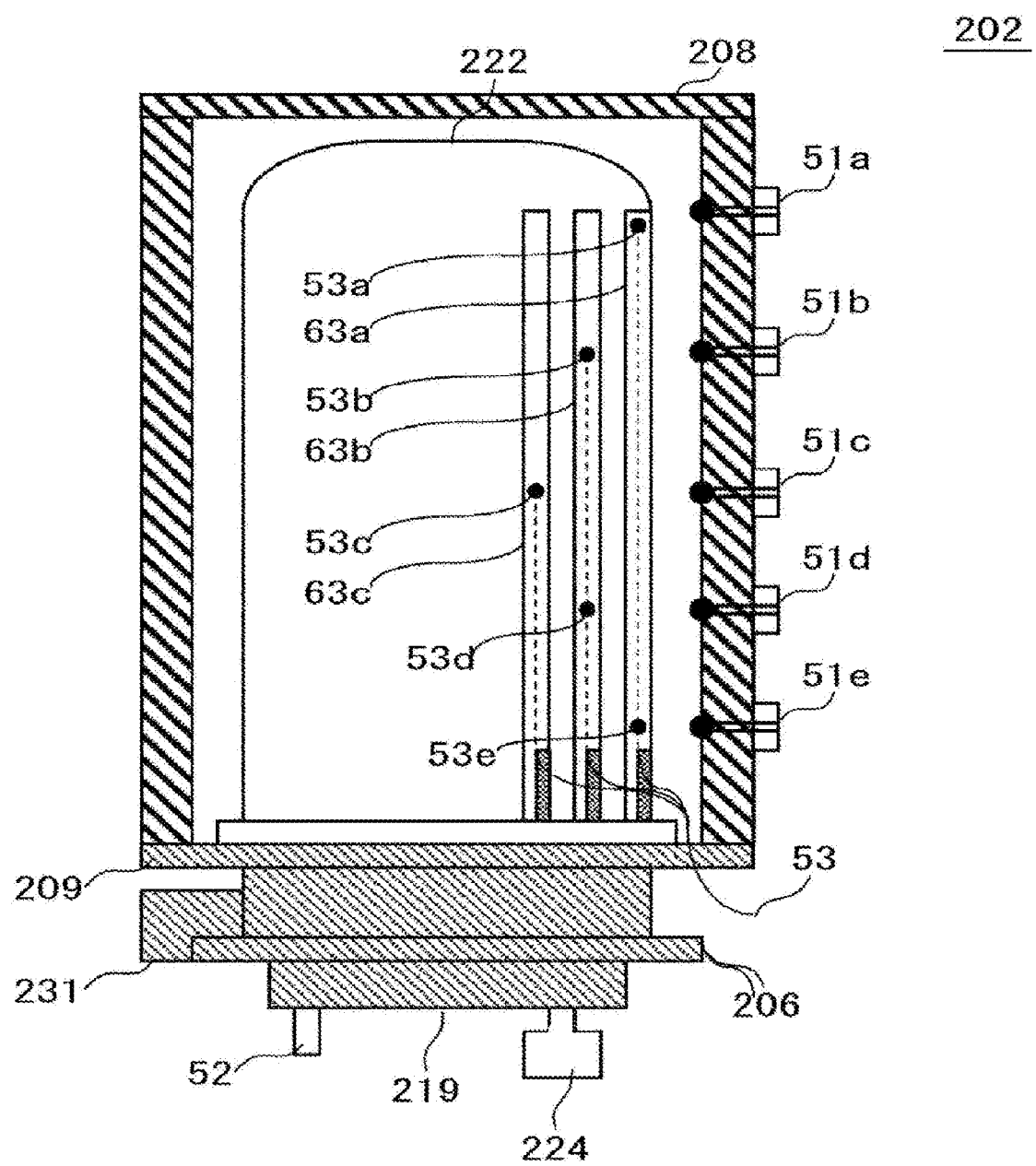
FIG. 9 is a view illustrating a processing furnace and a thermocouple according to a second embodiment of the present invention.
Figure 10:
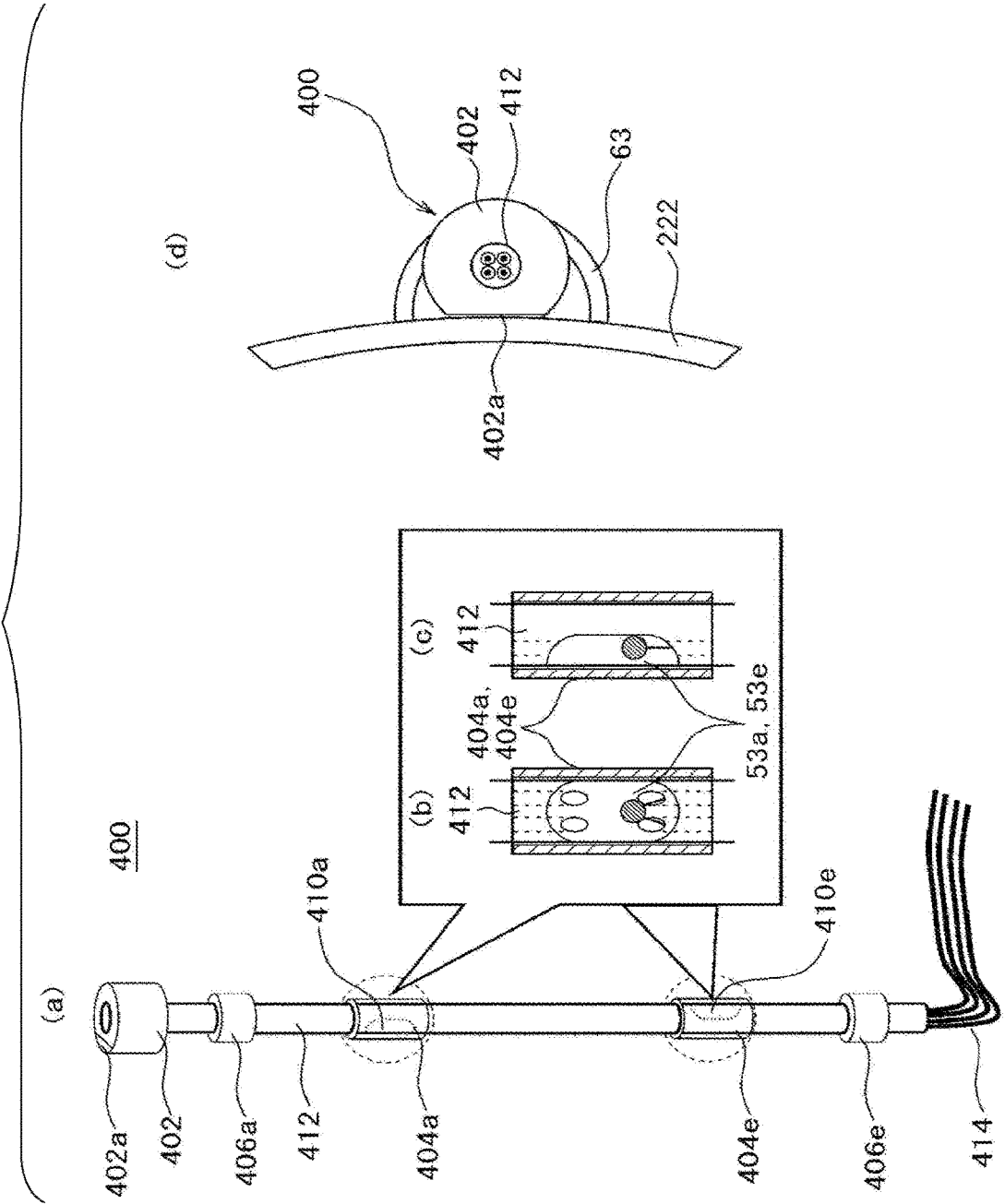
FIG. 10 is a view illustrating a reaction tube thermocouple support structure according to the second embodiment of the present invention.

Subsequently, a structure of the reaction tube thermocouple according to the second embodiment will be described with reference to FIGS. 9 and 10. FIG. 9 is a view illustrating a processing furnace and a thermocouple according to the second embodiment of the present invention. FIG. 10 is a view illustrating a reaction tube thermocouple support structure according to the second embodiment of the present invention. FIG. 10(a) is a view illustrating a configuration of a specific example of a reaction tube thermocouple support structure 400 according to the second embodiment; FIG. 10(b) is a front view of a cut portion 410 to be described later; FIG. 10(c) is a side view of the cut portion 410; and FIG. 10(d) is a schematic view illustrating the attachment of the reaction tube thermocouple support structure 400 to the reaction tube 222. Also, since a substrate processing operation and configurations other than the reaction tube and the reaction tube thermocouple support structure are identical to those of the first embodiment, a description thereof will be omitted herein.

In the second embodiment, by grouping the reaction tube thermocouples 53a to 53e into pairs and reducing the quartz material of the reaction tube thermocouple protection 63 or the number of components of the reaction tube thermocouple support structure, the processing furnace 202 is provided cheaply. In the example of FIG. 9, the reaction tube thermocouples 53a and 53e are grouped and installed in the reaction tube thermocouple space formed by the reaction tube thermocouple protection 63a. Also, the reaction tube thermocouples 53b and 53d are grouped and installed in the reaction tube thermocouple space formed by the reaction tube thermocouple protection 63b. The reaction tube thermocouples 53c is installed in the reaction tube thermocouple space formed by the reaction tube thermocouple protection 63c.

As illustrated in FIG. 10, the reaction tube thermocouple support structure 400 includes a reaction tube thermocouple 53, an insulating tube 412 having cut portions 410a and 410e, covers 404a and 404e covering the cut portions 410a and 410e respectively, a cap 402, and spacers 406a and 406e. Also, the temperature detecting apparatus includes a reaction tube thermocouple support structure 400, a reaction tube thermocouple protection 63, and a reaction tube 222.

In the second embodiment, two pairs of reaction tube thermocouples 53 are accommodated in the insulating tube 412 and installed in one reaction tube thermocouple protection 63. In the example of FIG. 10, the reaction tube thermocouples 53a and 53e are accommodated in one insulating tube 412. The reaction tube thermocouples 53a and 53e each include a thermocouple junction 23, and two thermocouple wires (plus line and minus line) joined at the thermocouple junction 23.

As illustrated in FIG. 10(d), the insulating tube 412 is a circular tube that is formed of alumina and has at least four (for example, four) holes having an inner diameter into which four thermocouple wires of the reaction tube thermocouples 53a and 53e can be inserted.

As illustrated in FIGS. 10(b) and 10(c), the cut portion 410a is formed by removing a central portion of the insulating tube 412 from the side surface. The cut portion 410a has a space for exposing two holes inside the insulating tube 412, inserting the thermocouple wire of the reaction tube thermocouple 53a from the holes, and including the junction 23 of the reaction tube thermocouple 53a. A cut position of the cut portion 410a corresponds to the reaction tube thermocouple 53a.

The cut portion 410e corresponds to the reaction tube thermocouple 53e. The cut portion 410e has the same structure as the cut portion 410a. The cut portions 410a and 410e is used by exposing two different holes among four holes of the insulating tube 412.

The cap 402 is a cylindrical or circular tube formed of alumina, is adhered and fixed to a top (upper leading end) of the insulating tube 412, and constitutes a leading end of the reaction tube thermocouple support structure 400. An outer diameter of the cap 402 is greater than the diameter of the reaction tube thermocouple space in the horizontal direction. As illustrated in FIG. 10(d), the cap 402 has a contact portion 402a surface-contacting the outer side surface of the reaction tube 222. A contact portion of the contact portion 402a with the reaction tube 222 is a flat surface or a curved surface that has a curvature radius substantially equal to that of the outer side surface of the reaction tube 222.

The cover 404a is a circular tube-shaped cover formed of alumina. After inserting the thermocouple wire of the reaction tube thermocouple 53a into the hole of the insulating tube 412, by accommodating the junction 23 of the reaction tube thermocouple 53a in the internal space of the cut portion 410a, the cover 404a is installed to adhere to the outside thereof. Accordingly, the cover 404a protects the junction 23 of the reaction tube thermocouple 53a. The thickness of the cover 404a is set such that the outer diameter of the cover 404a is smaller than the outer diameter of the spacers 406a and 406e.

Like the cover 404a, the cover 404e is a circular tube-shaped cover formed of alumina. After inserting the thermocouple wire of the reaction tube thermocouple 53e into the hole of the insulating tube 412, by accommodating the junction 23 of the reaction tube thermocouple 53e in the internal space of the cut portion 410e, the cover 404e is installed to adhere to the outside of the insulating tube 412. Accordingly, the cover 404e protects the junction 23 of the reaction tube thermocouple 53e. The thickness of the cover 404e is set such that the outer diameter of the cover 404e is smaller than the outer diameter of the spacers 406a and 406e.

At the upper side position and lower side position of the covers 404a and 404e, the spacers 406a and 406e are alumina circular tubes installed to adhere to the outside of the insulating tube 412, and the outer diameter thereof is set to be slightly smaller than the outer diameter of the reaction tube thermocouple space in the horizontal direction. Accordingly, when the reaction tube thermocouple support structure 400 is installed in the reaction tube thermocouple space, the junction 23 of each of the reaction tube thermocouples 53a and 53e is located at a substantially central position of the horizontal cross section of the reaction tube thermocouple space, and the covers 404a and 404e do not contact the outer wall of the reaction tube 222 and the inner wall of the reaction tube thermocouple protection 63, by vibration or the like.

In this manner, the junctions 23 of the reaction tube thermocouples 53a and 53e are disposed at the inside space of the cut portions 410a and 410e, respectively. Also, the plus line and the minus line of the thermocouple wire are respectively inserted into four holes of the insulating tube 412 under the cut portions 410a and 410e, and are extracted as a thermocouple lead portion 414 from the bottom surface of the insulating tube 412. At the thermocouple lead portion 414, the plus line and the minus line are covered with heat-resistance insulating tubes such that they do not in contact each other.

As illustrated in FIG. 10(d), the reaction tube thermocouple support structure 400 is inserted into the reaction tube thermocouple space and is supported with the bottom surface of the cap 402 caught on the upper surface of the reaction tube thermocouple protection 63. In addition, by installing the contact portion 402a of the cap 402 in contact with the outer wall of the reaction tube 222, the horizontal rotation of the insulating tube 412 can be prevented, the direction of the reaction tube thermocouple support structure 400 is fixed, and the thermocouple lead portion 414 is not wound.

Also, a lead portion extraction window 418 (not illustrated) is provided at a lower end portion of the reaction tube thermocouple protection 63, and the thermocouple lead portion 414 is extracted therefrom.

According to the second embodiment, at least the following effects B1 and B2 can be obtained.

(B1) Since four through-holes are provided at one insulating tube, two pairs of reaction tube thermocouples are inserted into the through-holes, and only one insulating tube is disposed in one reaction tube thermocouple protection tube, the number of insulating tubes and reaction tube thermocouple protection tubes can be reduced and the apparatus costs can be reduced.

(B2) Since the contact portion surface-contacting the outer wall of the reaction tube is provided at the side surface of the cap, the direction of the reaction tube thermocouple support structure can be fixed and the thermocouple lead portion can be prevented from being entangled.

Third Embodiment

In the third embodiment, the reaction tube thermocouple protection 63 is divided in the longitudinal direction (vertical direction), and the divided reaction tube thermocouple protections 63 have different thicknesses. That is, the reaction tube thermocouple protections 63 are divided corresponding to the reaction tube thermocouples 53 and are provided separately from each other, and the divided reaction tube thermocouple protections 63 have different thicknesses. Also, since a substrate processing operation and configurations other than the reaction tube and the reaction tube thermocouple support structure are identical to those of the first embodiment, a description thereof will be omitted herein.

As a result of the research by the inventors, it can be seen that, since the profile thermocouples 52a to 52e have different temperature characteristics, better results are obtained when the wall surfaces constituting the reaction tube thermocouple protections 63 located at positions corresponding to the profile thermocouples 52a to 52e in FIG. 3 have different thicknesses. For example, since the upper side of the profile thermocouple 52a is the ceiling of the heater unit 208, heat is hardly consumed from the profile thermocouple 52a and the response of measured temperatures is relatively rapid. On the other hand, since heat is easily consumed from a manifold 206 or a base 209 of a lower opening of the heater unit 208 due to cooling by a cooling unit provided under a furnace opening portion of the manifold or the like, when the profile thermocouples 52b 52c, 52d and 52e are located below, the response of measured temperatures of the profile thermocouple 52 to the heat emission from the heater unit 208 is slow.

Also, in consideration of the thermal influence of the vertical heater unit 208 on the junction 23 of the reaction tube thermocouple 53, the vertical length of the reaction tube thermocouple protection 63 is set to be, for example, about 10 cm 20 cm from the position of the junction 23. Accordingly, since the quartz material of the reaction tube thermocouple protection 63 is minimized, the manufacturing costs can be reduced, and since a gap occurs between two reaction tube thermocouple protections 63, the reaction tube thermocouple 53 can be easily installed.

Figure 11:
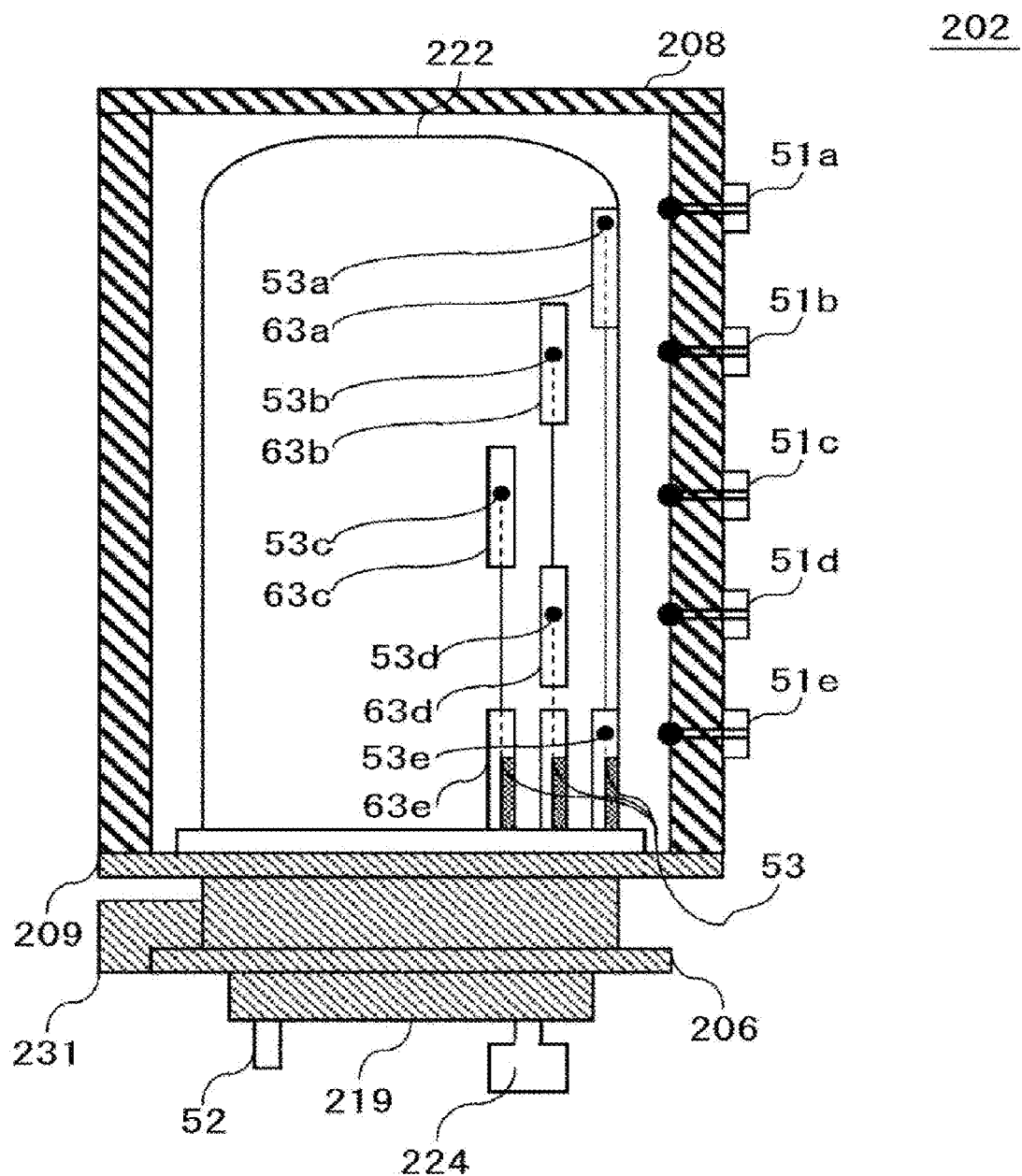
FIG. 11 is a view illustrating a processing furnace and a thermocouple according to a third embodiment of the present invention.

A detailed description will be made with reference to FIG. 11. FIG. 11 is a view illustrating a processing furnace and a thermocouple according to the third embodiment of the present invention.

The reaction tube thermocouple protection 63a corresponds to the reaction tube thermocouple 53a. The material of the reaction tube thermocouple protection 63a and the attachment method of the reaction tube 222 are the same as those of the reaction tube and the reaction tube thermocouple protection 63 according to the first embodiment; however, the length of the reaction tube thermocouple protection 63a of FIG. 11 is set in consideration of the vertical thermal influence as described above. However, since the upper portion of the reaction tube 222 is hemispheric, the length in the upward direction is set to allow vertical installation. Also, since the response of the measured temperature of the profile thermocouple 52a is relatively rapid, the thickness of the wall portion of the reaction tube thermocouple protection 63a is set to be slightly smaller than the thickness of the reaction tube 222. Thus, as compared to the case where the thickness of the reaction tube thermocouple protection 63a is set to be equal to the thickness of the reaction tube 222, the thermal capacity of the reaction tube thermocouple protection 63a is reduced.

The reaction tube thermocouple protection 63e corresponds to the reaction tube thermocouple 53e. Since the reaction tube thermocouple protection 63e has the same configuration as the reaction tube thermocouple protection 63a, its length is set in consideration of the thermal influence thereon in the vertical direction, and the length in the downward direction is set to the lower end of the reaction tube 222. Also, since the response of the measured temperature of the profile thermocouple 52e is relatively slow, its thickness is set to be slightly greater than the thickness of the reaction tube 222. Thus, as compared to the case where the thickness of the reaction tube thermocouple protection 63e is set to be equal to the thickness of the reaction tube 222, the thermal capacity of the reaction tube thermocouple protection 63e is increased.

The reaction tube thermocouple protection 63e is also installed vertically under the reaction tube thermocouple protections 63b and 63d and installed vertically under the reaction tube thermocouple protection 63c to bind a lower portion of the reaction tube thermocouple support structure 500 supported by it.

The reaction tube thermocouple protections 63b, 63c and 63d correspond to the reaction tube thermocouples 53b, 53c and 53d and have the same configuration as the reaction tube thermocouple protection 63a; however, their thicknesses may increase from the upper portion of the reaction tube toward the lower portion of the reaction tube, such as 63a<63b<63c<63d<63e. In this case, the thermal capacity can be increased in the order of the reaction tube thermocouple protections 63a, 63b, 63c, 63d and 63e.

Also, in the respective reaction tube thermocouple protections 63a to 63e, the thicknesses of the protection 63 are not necessarily equal, and a portion of the protection 63 may protrude in the horizontal direction. Also, the vertical lengths of the respective protections 63 are not necessarily equal, and the respective protections 63 may have different lengths. In this case, since the thermal capacities of the respective protections 63 can be finely adjusted, the optimal thermal capacities of the respective protections 63 can be easily set.

Figure 12:
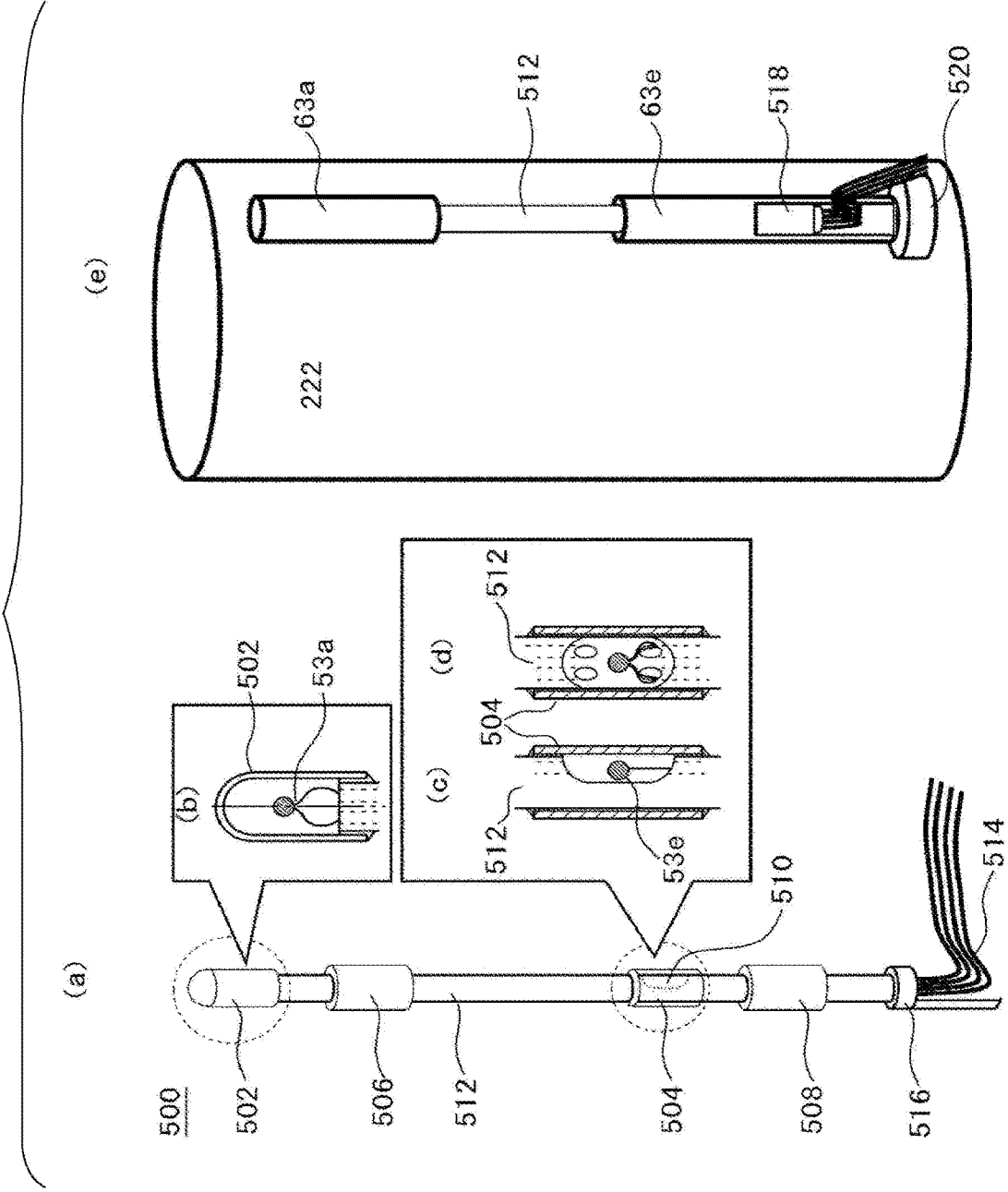
FIG. 12 is a view illustrating a reaction tube thermocouple support structure according to the third embodiment of the present invention.

A reaction tube thermocouple support structure according to the third embodiment will be described with reference to FIG. 12. FIG. 12 is a view illustrating a reaction tube thermocouple support structure according to the third embodiment of the present invention. FIG. 12(a) is a view illustrating a configuration of a specific example of a reaction tube thermocouple support structure 500 according to the third embodiment; FIG. 12(b) is a vertical sectional view of a cap 502 portion; FIG. 12(c) is a front view of a cut portion 510 to be described later; FIG. 12(d) is a side view of the cut portion 510; and FIG. 12(e) is a schematic view illustrating the attachment of the reaction tube thermocouple support structure 500 to the reaction tube 222.

As illustrated in FIG. 12(a), the reaction tube thermocouple support structure 500 includes a reaction tube thermocouple 53, an insulating tube 512 having a cut portion 510, a cover 504 covering the cut portion 510, a cap 502, spacers 506 and 508, and an insulating tube stopper 516. Also, the temperature detecting apparatus includes a reaction tube thermocouple support structure 500, a reaction tube thermocouple protection 63, and a reaction tube 222.

In the first and second embodiments, the insulating tubes 312 and 412 are supported by the caps 302 and 402. However, in the third embodiment, the insulating tube 512 is supported by the insulating tube stopper 516 as described later. The insulating tube stopper 516 is formed of, for example, alumina.

Also, in the third embodiment, two pairs of reaction tube thermocouples 53 are accommodated in one insulating tube 512, and only one reaction tube thermocouple 53 is installed in the reaction tube thermocouple protection 63 (reaction tube thermocouple space). In the example of FIG. 12, the reaction tube thermocouples 53a and 53e are accommodated in one insulating tube 512. The reaction tube thermocouples 53a and 53e each include a thermocouple junction 23, and two thermocouple wires (plus line and minus line) joined at the thermocouple junction 23.

Like the insulating tube 412 of the second embodiment, the insulating tube 512 is a circular tube that is formed of alumina and has at least four (for example, four) holes having an inner diameter into which four thermocouple wires of the reaction tube thermocouples 53a and 53e can be inserted.

As illustrated in FIG. 12(b), the cap 502 is adhered and fixed to a top (upper leading end) of the insulating tube 512, and constitutes a leading end of the reaction tube thermocouple support structure 500. The cap 502 is a cover that is formed of alumina and has a cap shape, and covers and protects the junction 23 of the reaction tube thermocouple 53a in the internal space thereof. The thickness of the cap 502 is set such that the horizontal diameter of the cap 502 is smaller than the horizontal diameter of the spacer 506 or 508.

As illustrated in FIGS. 12(c) and 12(d), the cut portion 510a is formed by removing a central portion of the insulating tube 512 from the side surface. The cut portion 510a has a space for exposing two holes inside the insulating tube 512, inserting the thermocouple wire of the reaction tube thermocouple 53e from the holes, and including the junction 23 of the reaction tube thermocouple 53e. A cut position of the cut portion 510 corresponds to the reaction tube thermocouple 53e.

The cover 504 is a circular tube-shaped cover formed of alumina. After inserting the thermocouple wire of the reaction tube thermocouple 53e into the hole of the insulating tube 512, by accommodating the junction 23 of the reaction tube thermocouple 53e in the internal space of the cut portion 510, the cover 504 is installed to adhere to the outside thereof. Accordingly, the cover 504 protects the junction 23 of the reaction tube thermocouple 53e. The thickness of the cover 504 is set such that the outer diameter of the cover 504 is smaller than the outer diameter of the spacer 506 or 508.

The spacers 506 and 508 are alumina circular tubes installed to adhere to the lower portion of the cap 502 and the lower portion of the cover 504, respectively, and the outer diameter thereof is set to be slightly smaller than the outer diameter of the reaction tube thermocouple space in the horizontal direction. Accordingly, when the reaction tube thermocouple support structure 500 is installed in the reaction tube thermocouple space, the junction 23 of each of the reaction tube thermocouples 53a and 53e is located at a substantially central position of the horizontal cross section of the reaction tube thermocouple space, and the cap 502 and the cover 504 do not contact the outer wall of the reaction tube 222 and the inner wall of the reaction tube thermocouple protection 63, by vibration or the like.

In this manner, the junction 23 of the reaction tube thermocouple 53a is located in the internal space of the cap 502. Also, the plus line and the minus line of the thermocouple wire are respectively inserted into two holes of the insulating tube 512, and are extracted as a thermocouple lead portion 514 from the bottom surface of the insulating tube 512.

Also, the junction 23 of the reaction tube thermocouple 53e is located in the internal space of the cut portion 510. Also, the plus line and the minus line of the thermocouple wire are respectively inserted into two holes (different from two holes into which the reaction tube thermocouple 53a is inserted) of the insulating tube 512 thereunder, and are extracted as a thermocouple lead portion 514 from the bottom surface of the insulating tube 512. At the thermocouple lead portion 514, the plus line and the minus line are covered with heat-resistance insulating tubes such that they do not contact each other.

As illustrated in FIG. 12(e), the reaction tube thermocouple support structure 500 is inserted into the divided reaction tube thermocouple space including the reaction tube thermocouple protections 63a and 63e, and is placed on a flange portion 520 installed at a lower end portion of the reaction tube thermocouple protection 63e. Also, a lead portion extraction window 518 is provided at a lower end portion of the reaction tube thermocouple protection 63e such that the thermocouple lead portion 514 can be extracted therefrom.

As another example, the reaction tube thermocouple support structure 500 may not be placed on the flange portion 520, but may be supported by inserting the insulating tube stopper 516 under the reaction tube thermocouple support structure 500 into a protection tube holder 36.

In the case of this configuration, a state of the thermocouple lead portion 514 in the protection tube holder 36 will be described with reference to FIGS. 13 and 14. FIG. 13 is a view illustrating a state of the thermocouple lead portion according to the third embodiment of the present invention. FIG. 13A is a view of the insulating tubes 512a, 512b and 512c accommodated in the reaction tube thermocouple protection 63, from the center of the processing furnace 202. FIG. 13B is a vertical sectional view of FIG. 13A from the side. FIG. 14 is a horizontal sectional view at an A-A region of FIG. 13. FIG. 14A is a sectional view of the insulating tube 512a; FIG. 14B is a sectional view of the insulating tube 512b; and FIG. 14C is a sectional view of the insulating tube 512c. For easy understanding, in FIGS. 13 and 14, illustration of the reaction tube thermocouple protection 63, the cap 502, the cover 504, and the spacer 506 is omitted.

The insulating tube 512a is accommodated in the reaction tube thermocouple protections 63a and 63e of FIG. 11; the insulating tube 512b is accommodated in the reaction tube thermocouple protections 63b and 63d of FIG. 11; and the insulating tube 512c is accommodated in the reaction tube thermocouple protection 63c of FIG. 11.

As illustrated in FIGS. 13A and 13B, the lower end of the insulating tube 512a is inserted into the insulating tube stopper 516a, and the lower end of the insulating tube stopper 516a is supported by the bottom portion of the protection tube holder 36. Likewise, the lower end of the insulating tube 512b is inserted into the insulating tube stopper 516b, and the lower end of the insulating tube stopper 516b is supported by the bottom portion of the protection tube holder 36. Also, the lower end of the insulating tube 512c is inserted into the insulating tube stopper 516c, and the lower end of the insulating tube stopper 516c is supported by the bottom portion of the protection tube holder 36.

As illustrated in FIG. 14A, the insulating tube 512a has a cross section of a circular shape, four holes pass therethrough, and the thermocouple wires 21a and 22a for the reaction tube thermocouple 53a and the thermocouple wires 21e and 22e for the reaction tube thermocouple 53e are inserted into the four holes and accommodated therein.

Also, as illustrated in FIG. 14B, the insulating tube 512b has a cross section of a circular shape, four holes pass therethrough, and the thermocouple wires 21b and 22b for the reaction tube thermocouple 53b and the thermocouple wires 21d and 22d for the reaction tube thermocouple 53d are inserted into the four holes and accommodated therein.

Also, as illustrated in FIG. 14C, the insulating tube 512c has a cross section of a circular shape, four holes pass therethrough, and the thermocouple wires 21c and 22c for the reaction tube thermocouple 53c are inserted into two holes among the four holes and accommodated therein.

As illustrated in FIG. 13B, the lower end of thermocouple wire 21a is inserted into a wire holding portion 35 vertically from the lower end of the insulating tube 512a in a protection tube holder 36 of hollow structure, and is connected to the control unit 280 outside the processing chamber 204. In the protection tube holder 36, there thermocouple wires are covered with a heat-resistance tube up to about 800° C. (for example, a tube woven with ceramic fibers or glass fibers) and are insulated from each other.

Also, although only thermocouple wire 21a is illustrated in FIG. 13B, since the thermocouple wires 22a, 21e and 22e, the thermocouple wires 21b, 22b, 21d and 22d inside the insulating tube 512b, or the thermocouple wires 21c and 22c inside the insulating tube 512c are the same as the thermocouple wire 21a, thermocouple wire 21a will be described below.

The thermocouple wire 21a extends vertically downward from the lower end of the insulating tube 512a, changes into the horizontal direction, and is inserted into the wire holding portion 35 from one end 35a of the wire holding portion 35 (the center side of the processing chamber 204). The size from the one end 35a to the bottom portion of the protection tube holder 36 is, for example, about 10 mm to about 15 mm, and a buffer area 38 is formed in the protection tube holder 36 so that the thermocouple wire 21a is not bound by the protection tube holder 36. The state in which the thermocouple wire 21a is not bound by the protection tube holder 36 is, for example, a state in which the thermocouple wire 21a does not contact the bottom portion of the protection tube holder 36 in thermal expansion or a force corresponding to disconnection is applied to the thermocouple wire 21a even when the thermocouple wire 21a contacts the bottom portion of the protection tube holder 36.

The insulating tube stopper 516a supports the bottom portion of the insulating tube 512a at a position higher than the buffer area 38, that is, at a position higher than one end 35a of the wire holding portion 35. Accordingly, the buffer area can be widened more easily.

The inside of the insulating tube stopper 516a has a through-hole therein, and the thermocouple wire 21a is guided by the through-hole from the lower end of the insulating tube 512a to the buffer area 38. Accordingly, the thermocouple wire can easily maintain a straight-line shape in the vertical direction, and the binding force received from the insulating tube stopper can be suppressed.

In this manner, a position 35a of the wire holding portion 35 at which the thermocouple wire 21a is inserted, and a lower end position of the insulating tube 512a from which the thermocouple wire 21a is extracted, is set to be about 10 mm from the bottom portion of the protection tube holder 36. That is, by supporting it at the position higher than the buffer area 38, the thermocouple wire 21a can be suppressed from contacting the bottom of the protection tube holder 36 and being bound by a force corresponding to disconnection, in thermal expansion.

In FIG. 13B, in the buffer area 38, the thermocouple wire 21a in a standby state (500° C.) before/after thermal treatment is represented by a solid line, and the thermocouple wire 21a in a process state (1200° C.) during thermal treatment is represented by a broken line.

Also, the thermocouple wire 21a is fixed in the wire holding portion 35 by a ceramic adhesive or the like. This is to prevent the thermocouple wire 21a inside the buffer area 38 from being extracted to the outside of the processing chamber 204.

As described above, the thermocouple junction 23 is supported by the upper end or the mid-flow portion of the insulating tube 512, and the insulating tube 512 is supported by the insulating tube stopper 516, and the insulating tube stopper 516 is supported by the protection tube holder 36. That is, the upper ends of the thermocouple wires 21 and 22 are supported by the insulating tube 512 or the like. Also, the thermocouple wires 21 and 22 is in a state in which a portion extending from the lower end of the insulating tube 512 is not bound by the bottom portion of the protection tube holder 36 in the buffer area 38. Accordingly, in thermal expansion, the thermocouple wires 21 and 22 can maintain a straight-line shape by their own weight, and can be suppressed from being partially curved. Consequently, it is possible to suppress the generation of a strong frictional force between the insulating tube 512 and the thermocouple wires 21 and 22 and thus suppress the disconnection of the thermocouple wires 21 and 22.

Also, the linear expansion coefficient of the insulating tube 512 is smaller than the linear expansion coefficient of the thermocouple wires 21 and 22, and a position of the thermocouple junction 23 accompanied with thermal expansion, that is, a change in the temperature measurement position can be reduced as compared to the related art. For example, the linear expansion coefficient of the insulating tube 512 is $8.1 \times 10^{-4}/°$ C., the linear expansion coefficient of the thermocouple wire 21 is $10.2 \times 10^{-4}/°$ C., and the linear expansion coefficient of the thermocouple wire 22 is $10.6 \times 10^{-4}/°$ C.

According to the third embodiment, at least the following effects C1 to C7 can be obtained.

(C1) Since the reaction tube thermocouple protection tubes are separated and divided corresponding to the reaction tube thermocouples, the material (for example, quartz) for the reaction tube thermocouple protection tubes can be reduced.

(C2) Since the divided respective reaction tube thermocouple protection tubes has different thicknesses, the thermal capacities of the respective reaction tube thermocouple protection tubes can be different from each other, and the temperature characteristics of the reaction tube thermocouples disposed in the respective reaction tube thermocouple protection tubes can be approached to the temperature characteristics of the profile thermocouple, that is, the temperature characteristics in a heat treatment furnace.

(C3) Since the thickness of the uppermost reaction tube thermocouple protection tube among the divided respective reaction tube thermocouple protection tubes is smaller than the thickness of the lowermost reaction tube thermocouple protection tube, the temperature characteristics of the uppermost and lowermost reaction tube thermocouples can be approached to the temperature characteristics of the uppermost and lowermost profile thermocouples.

(C4) Since the thickness of each reaction tube thermocouple protection tube increases as the positions of the divided respective reaction tube thermocouple protection tubes move from the upper portion to the lower portion, the temperature characteristics of the respective reaction tube thermocouples can be approached to the temperature characteristics of the profile thermocouples.

(C5) Since the two divided reaction tube thermocouple protection tubes are disposed on the same straight line, one insulating tube into which two reaction tube thermocouples are inserted can be disposed inside two reaction tube thermocouple protection tube disposed on the same straight line. Accordingly, the number of insulating tubes used can be reduced, and the reaction tube thermocouples can be easily installed because a gap is generated between two reaction tube thermocouple protection tubes.

(C6) Since the junction of the reaction tube thermocouple is disposed inside the cap of the upper end of the insulating tube and the insulating tube is supported by the insulating tube stopper, the temperature near the upper end portion of the reaction tube thermocouple protection tube can be measured.

(C7) Since the buffer area is provided under the insulating tube, the disconnection of the reaction tube thermocouple wire can be suppressed.

Fourth Embodiment

In the above-described third embodiment, two pairs of reaction tube thermocouples 53 are disposed in one insulating tube 512. However, only one pair of reaction tube thermocouples 53 may be disposed in one insulating tube 51 according to the fourth embodiment. That is, as in third embodiment, in the fourth embodiment, the reaction tube thermocouple protections 63 are divided corresponding to the reaction tube thermocouples 53 and are provided separately from each other, and the divided reaction tube thermocouple protections 63 have different thicknesses, that is, different thermal capacities. That is, by changing the height position of the junction 23 of the reaction tube thermocouple 53, five sets of the reaction tube thermocouple protections 63c and 63e, the insulating tube 512c, and the reaction tube thermocouple 53c illustrated in FIG. 11 of the third embodiment are provided in parallel on the outer wall of the reaction tube 222. That is, in the fourth embodiment, five insulating tubes 512, in each of which a pair of reaction tube thermocouples 53 are disposed, are accommodated in five pairs of reaction tube thermocouple protections 63 that are vertically disposed in parallel on the outer wall of the reaction tube 222.

Also, in the fourth embodiment, since a substrate processing operation and configurations other than the reaction tube and the reaction tube thermocouple support structure are identical to those of the third embodiment, a description thereof will be omitted herein.

According to the fourth embodiment, at least the following D1 can be obtained.

(D1) Since the insulating tubes 512 have only to include two holes, the outer diameter thereof can be reduced and thus the reaction tube thermocouple space can be reduced. Consequently, the outer diameter of the reaction tube thermocouple protection tube 63 is reduced, and thus a space for providing the reaction tube thermocouple protection tube or the reaction tube thermocouple support structure can be easily obtained.

Figure 15A:
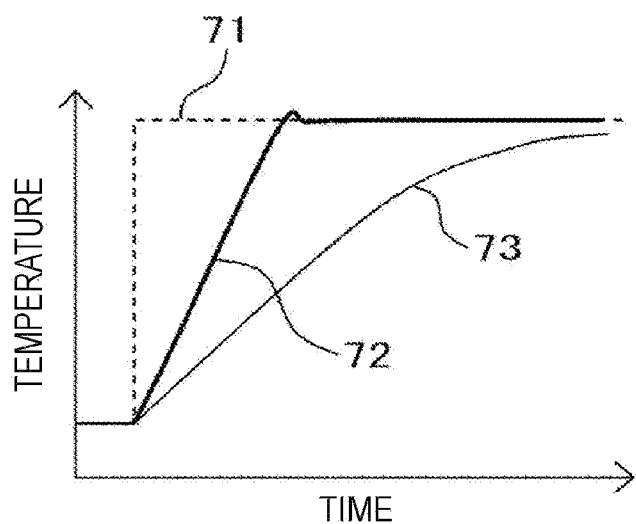
FIGS. 15A and 15B are diagrams illustrating the temperature-response characteristics of the thermocouples according to the embodiments of the present invention.
Figure 15B:
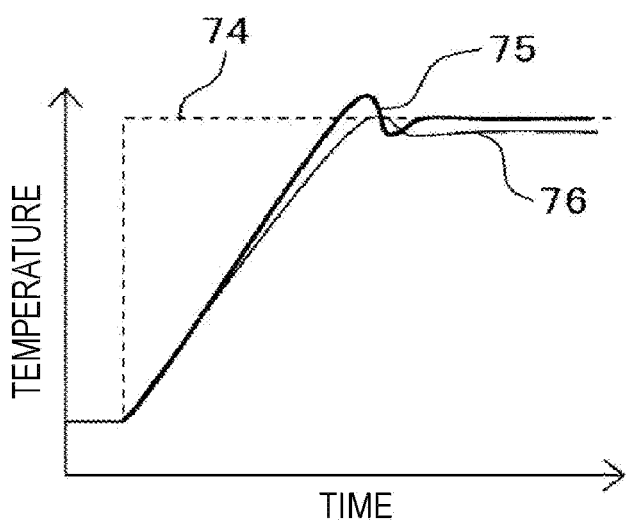

FIG. 15 is a diagram illustrating the temperature-response characteristics of the thermocouples of the first to fourth embodiments. FIG. 15A illustrates temperature responses of a heater thermocouple 72 and a profile thermocouple 73 with respect to a target temperature 71 according to the related art. FIG. 15B illustrates temperature responses of the reaction tube thermocouple 75 and the profile thermocouple 76 with respect to a target temperature 74 according to the first to fourth embodiments. In FIG. 15, the vertical axis represents temperature, and the horizontal axis represents time.

As illustrated in FIG. 15A, the heater thermocouple 72 has a rapid response because it is located near the heating body of the heater; but the profile thermocouple 73 has a slow response because it is located inside the reaction tube. As illustrated in FIG. 15B, since the reaction tube thermocouple 75 can be set to have the same response performance as the profile thermocouple 76, when the measured temperature of the reaction tube thermocouple 75 is fed back to control the heater, the wait time after the measured temperature of the reaction tube thermocouple 75 becomes a normal state can be reduced. Consequently, the wait time until the start of a heat treatment can be further reduced by controlling the heater by the reaction tube thermocouple as compared to the case of controlling the heater by the heater thermocouple.

Also, in the apparatus operation state, even when the profile thermocouple is not installed, since the measured temperature of the reaction tube thermocouple can be used instead and temperature measurement can be performed more accurately, the problem in heat treatment caused by inaccurate temperature measurement can be removed.

In this manner, since the reaction tube thermocouple is installed inside the reaction tube thermocouple protection tube contacting the outer wall of the reaction tube, the temperature-response performance of the measured temperature of the reaction tube thermocouple can be set to be equal to that of the profile thermocouple.

Also, the present invention is not limited to the above-described embodiments, and various modifications may be made therein without departing from the scope of the present invention.

In the third and fourth embodiments, the divided reaction tube thermocouple protections 63 are set to have different thicknesses. However, also in the reaction tube thermocouple protection 63 of the first and second embodiments, which is not divided, the thickness of the reaction tube thermocouple protection 63 may be set to be different at a place near the junction 23 of the reaction tube thermocouple 53. Also, in all the embodiments, the materials of the reaction tube thermocouple protection tube may be set to be different in thermal capacity.

Also, in the third and fourth embodiments, a combination of two pairs of reaction tube thermocouples are illustrated as a combination of reaction tube thermocouples 53a and 53e, and 53b and 53d, another combination thereof may also be possible.

Also, in the above embodiments, although a wafer is described as a processing target, the processing target may also be a substrate other than a wafer, a photomask, a print interconnection substrate, a liquid crystal panel, a compact disk, or a magnetic disk.

Also, the present invention may be applied not only to a semiconductor device manufacturing apparatus, but also to a glass substrate processing apparatus such as an LCD manufacturing apparatus, and other types of substrate processing apparatuses. The contents of substrate processing may be not only a CVD process, a PVD process, a film forming process for forming an oxide film, a nitride film, a metal-containing film, or the like, but also an exposure process, a lithography process, a deposition process, or the like.

Hereinafter, exemplary aspects of the present invention will be supplementarily noted.

(Supplementary Note 1)

According to one aspect of the present invention, there is provided a substrate processing apparatus including:

a reaction tube configured to accommodate a substrate holder holding a plurality of substrates and process a substrate held on the substrate holder;

a heating unit installed outside the reaction tube and configured to heat an inside of the reaction tube;

a protection tube installed in contact with an outer wall of the reaction tube;

an insulating tube disposed inside the protection tube and having through-holes therein;

a thermocouple having a thermocouple junction provided at an upper end thereof, and a first thermocouple wire and a second thermocouple wire joined at the thermocouple junction and inserted into the through-holes of the insulating tube;

a gas supply unit configured to supply a gas, for processing a substrate accommodated in the reaction tube, into the reaction tube; and an exhaust unit configured to exhaust a gas from the reaction tube.

(Supplementary Note 2)

In the substrate processing apparatus according to Supplementary Note 1, a thickness of a wall portion of the protection tube may vary according to an installation position of the protection tube on the outer wall of the reaction tube, and one or more protection tubes may be provided.

(Supplementary Note 3)

In the substrate processing apparatus according to Supplementary Note 2, a plurality of protection tubes may be installed on the outer wall of the reaction tube separately in a vertical direction.

(Supplementary Note 4)

In the substrate processing apparatus according to Supplementary Note 3, the plurality of protection tubes may be configured such that a thickness of a wall portion of the uppermost protection tube is smaller than a thickness of a wall portion of the lowermost protection tube.

(Supplementary Note 5)

In the substrate processing apparatus according to Supplementary Notes 1 to 4, the insulating tube may have four or more through-holes, and two pairs of thermocouple wires of the thermocouple may be inserted into the through-holes.

(Supplementary Note 6)

In the substrate processing apparatus according to Supplementary Notes 1 to 5, a cap having an outer diameter greater than a horizontal outer diameter of the insulating tube may be provided at an upper end of the insulating tube, and a bottom surface of the cap may be supported by an upper surface of the protection tube such that the insulating tube is supported by the protection tube.

(Supplementary Note 7)

In the substrate processing apparatus according to Supplementary Note 6, the cap may have a contact portion for preventing a horizontal rotation of the insulating tube by contacting a side surface thereof with the outer wall of the reaction tube.

(Supplementary Note 8)

In the substrate processing apparatus according to Supplementary Notes 1 to 7, the insulating tube may have a cut portion accommodating the thermocouple junction, a cover covering the cut portion may be provided at a position of the cut portion of the insulating tube, and a spacer having an outer diameter greater than a horizontal outer diameter of the cover may be provided under or over the cut portion of the insulating tube.

(Supplementary Note 9)

In the substrate processing apparatus according to Supplementary Notes 1 to 8, a buffer area may be provided under the insulating tube to suppress the thermocouple wires from being bound when the thermocouple wires extracted from a lower end of the insulating tube is thermally expanded.

(Supplementary Note 10)

In the substrate processing apparatus according to Supplementary Note 1, a thermal capacity of the protection tube may vary according to an installation position of the protection tube on the outer wall of the reaction tube.

(Supplementary Note 11)

In the substrate processing apparatus according to Supplementary Note 1, a heating unit thermocouple may be disposed near the heating unit to detect a temperature of the heating unit.

(Supplementary Note 12)

According to another aspect of the present invention, there is provided a method of manufacturing a semiconductor device by using a substrate processing apparatus including: a reaction tube configured to accommodate a substrate holder holding a plurality of substrates and process a substrate held on the substrate holder; a heating unit installed outside the reaction tube and configured to heat an inside of the reaction tube; a protection tube installed in contact with an outer wall of the reaction tube; an insulating tube disposed inside the protection tube and having through-holes therein; a thermocouple having a thermocouple junction provided at an upper end thereof, and a first thermocouple wire and a second thermocouple wire joined at the thermocouple junction and inserted into the through-holes of the insulating tube; a gas supply unit configured to supply a process gas, for processing a substrate accommodated inside the reaction tube, into the reaction tube; and an exhaust unit configured to exhaust a gas from the reaction tube, the method including:

accommodating the substrate holder holding the plurality of substrates into the reaction tube;

heating the inside of the reaction tube by the heating unit;

detecting a temperature by using the thermocouple inserted into the insulating tube inside the protection tube;

supplying the process gas from the gas supply unit into the reaction tube;

exhausting a gas from the reaction tube by the exhaust unit; and processing the plurality of substrates on the substrate holder accommodated in the reaction tube, based on the temperature detected.

(Supplementary Note 13)

According to another aspect of the present invention, there is provided a temperature detecting method using a substrate processing apparatus including: a reaction tube configured to accommodate a substrate holder holding a plurality of substrates and process a substrate held on the substrate holder; a heating unit installed outside the reaction tube and configured to heat an inside of the reaction tube; a protection tube installed in contact with an outer wall of the reaction tube; an insulating tube disposed inside the protection tube and having through-holes therein; and a thermocouple having a thermocouple junction provided at an upper end thereof, and thermocouple wires joined at the thermocouple junction and inserted into the through-holes of the insulating tube, the temperature detecting method including:

heating the inside of the reaction tube by the heating unit; and detecting a temperature by using the thermocouple inserted into the insulating tube inside the protection tube.

(Supplementary Note 14)

According to another aspect of the present invention, there is provided a thermocouple support structure including:

an insulating tube that has a pillar shape and has through-holes intersecting an inside of the pillar shape in a longitudinal direction; and a thermocouple having a thermocouple junction provided at an upper end thereof, and a first thermocouple wire and a second thermocouple wire joined at the thermocouple junction and inserted into the through-holes of the insulating tube, wherein the insulating tube has a cut portion accommodating the thermocouple junction, a cover covering the cut portion is provided at a position of the cut portion, and a spacer having an outer diameter greater than a horizontal outer diameter of the cover is provided under or over the cut portion.

(Supplementary Note 15)

In the thermocouple support structure according to Supplementary Note 14, the insulating tube may have four or more through-holes, and two pairs of thermocouple wires of the thermocouple may be inserted into the through-holes.

(Supplementary Note 16)

In the thermocouple support structure according to Supplementary Note 14 or 15, a cap having an outer diameter greater than a horizontal outer diameter of the insulating tube may be provided at an upper end of the insulating tube.

(Supplementary Note 17)

In the thermocouple support structure according to Supplementary Note 16, the cap may have a flat portion at a side surface thereof.

What is claimed is:

1. An assembly for a substrate processing apparatus, the assembly comprising:

a reaction tube, having a substantially cylindrical shape for accommodating a substrate holder in a vertical direction, the substrate holder holding a plurality of substrate, each substrate being in a horizontal posture and stacked vertically;

an insulating tube including a support portion for supporting a thermocouple junction, the thermocouple junction being connected to a pair of thermocouple wires, and a pair of through-holes that accommodate the pair of thermocouple wires therein vertically; and a thermocouple protection, mechanically fixed to an outer side surface of the reaction tube in the vertical direction, the thermocouple protection having a shape for covering a part of the insulating tube, an inner diameter of the space being smaller than a diameter of the outer side surface of the reaction tube.

2. The assembly according to claim 1, wherein the thermocouple protection is formed of quarts, mechanically fixed to the outer side surface of the reaction tube being formed of quartz.

3. The assembly according to claim 1, wherein the thermocouple protection having a cross section of a semicircular tubular shape for covering a part of the insulating tube, an inner diameter of the space being smaller than a diameter of the outer side surface of the reaction tube.

4. An assembly for a substrate processing apparatus, the assembly comprising:

a reaction tube, having a substantially cylindrical shape for accommodating a substrate holder in a vertical direction, the substrate holder holding a plurality of substrate, each substrate being in a horizontal posture and stacked vertically;

a first insulating tube including a first support portion for supporting a first thermocouple junction, the first thermocouple junction being connected to a first pair of thermocouple wires, and a first pair of through-holes that accommodate the first pair of thermocouple wires therein vertically;

a first thermocouple protection, mechanically fixed to a first outer side surface of the reaction tube in the vertical direction, the first thermocouple protection having a first shape for covering a first part of the first insulating tube, a first inner diameter of the first space being smaller than a diameter of the outer side surface of the reaction tube;

a second insulating tube including a second support portion for supporting a second thermocouple junction, the second thermocouple junction being connected to a second pair of thermocouple wires, and a second pair of through-holes that accommodate the second pair of thermocouple wires therein vertically; and a second thermocouple protection, mechanically fixed to a second outer side surface of the reaction tube in the vertical direction, the second thermocouple protection having a second shape for covering a second part of the second insulating tube, a second inner diameter of the second space being smaller than a diameter of the outer side surface of the reaction tube.

5. The assembly according to claim 4, wherein a first height of the first thermocouple junction is different from a second height of the second thermocouple junction.

6. The assembly according to claim 5, wherein a first vertical length of the first thermocouple protection is different from a second vertical length of the second thermocouple protection.

7. The assembly according to claim 5, wherein a first thickness of a first wall portion of the first thermocouple protection is different from a second thickness of a second wall portion of the second thermocouple protection.

8. The assembly according to claim 5, wherein a first thermal capacity of the first thermocouple protection is different from a second thermal capacity of the second thermocouple protection.

* * * * *